(12) United States Patent
Lee et al.

(10) Patent No.: US 10,978,465 B2
(45) Date of Patent: Apr. 13, 2021

(54) THREE-DIMENSIONAL SEMICONDUCTOR DEVICE HAVING A MEMORY BLOCK AND SEPARATION STRUCTURES

(71) Applicant: SAMSUNG ELECTRONICS CO., LTD., Suwon-si (KR)

(72) Inventors: Byoung Il Lee, Seoul (KR); Yu Jin Seo, Daejeon (KR); Jun Eon Jin, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 223 days.

(21) Appl. No.: 16/227,985

(22) Filed: Dec. 20, 2018

(65) Prior Publication Data

US 2019/0355737 A1 Nov. 21, 2019

(30) Foreign Application Priority Data

May 18, 2018 (KR) .................. 10-2018-0057306

(51) Int. Cl.
*H01L 27/11565* (2017.01)
*H01L 27/11524* (2017.01)
(Continued)

(52) U.S. Cl.
CPC .... *H01L 27/11565* (2013.01); *H01L 23/5226* (2013.01); *H01L 23/5283* (2013.01); *H01L 27/1157* (2013.01); *H01L 27/11519* (2013.01); *H01L 27/11524* (2013.01); *H01L 27/11556* (2013.01); *H01L 27/11582* (2013.01)

(58) Field of Classification Search
CPC ......... H01L 27/11524; H01L 27/11556; H01L 27/1157; H01L 27/11582; H01L 27/11565; H01L 27/11519; H01L 27/11575; H01L 27/11573; H01L 27/11529; H01L 23/5226;
(Continued)

(56) References Cited

U.S. PATENT DOCUMENTS 8,139,413 B2 * 3/2012 Kim .................. G11C 16/08
365/185.11
8,304,348 B2 11/2012 Hashimoto
(Continued)

FOREIGN PATENT DOCUMENTS

KR 10-2017-0079309 7/2017

*Primary Examiner* — Khiem D Nguyen
(74) *Attorney, Agent, or Firm* — F. Chau & Associates, LLC

(57) ABSTRACT

A three-dimensional semiconductor device includes first and second extended regions disposed on a substrate spaced apart from each other, a memory block disposed on the substrate between the first and second extended regions, and first and second main separation structures disposed on the substrate spaced apart from each other. The first extended region, the memory block and the second extended region are disposed between the first and second main separation structures. The memory block includes data storage regions and word lines. The word lines extend from the memory block and pass through the first and second extended regions. A distance between the first and second main separation structures located on both sides of the first extended region is greater than a distance between the first and second main separation structures located on both sides of the memory block.

20 Claims, 30 Drawing Sheets

(51) Int. Cl.
*H01L 27/11556* (2017.01)
*H01L 23/522* (2006.01)
*H01L 27/1157* (2017.01)
*H01L 27/11582* (2017.01)
*H01L 23/528* (2006.01)
*H01L 27/11519* (2017.01)

(58) Field of Classification Search
CPC .......... H01L 21/76877; H01L 29/7926; H01L 21/11529
See application file for complete search history.

(56) References Cited

U.S. PATENT DOCUMENTS

| | | | |
|---|---|---|---|
| 9,136,005 B2 * | 9/2015 | Choe | G11C 16/0483 |
| 9,343,452 B2 | 5/2016 | Yun et al. | |
| 9,419,013 B1 | 8/2016 | Lee et al. | |
| 9,515,087 B2 * | 12/2016 | Son | H01L 27/11526 |
| 2012/0119287 A1 | 5/2012 | Park et al. | |
| 2013/0235673 A1 * | 9/2013 | Kwak | G11C 16/20 |
| | | | 365/185.18 |
| 2015/0325586 A1 * | 11/2015 | Seol | H01L 29/42332 |
| | | | 257/773 |
| 2016/0268287 A1 | 9/2016 | Park et al. | |
| 2017/0084532 A1 | 3/2017 | Son et al. | |
| 2017/0194255 A1 | 7/2017 | Oh | |
| 2018/0261618 A1 * | 9/2018 | Lee | H01L 27/1157 |

* cited by examiner

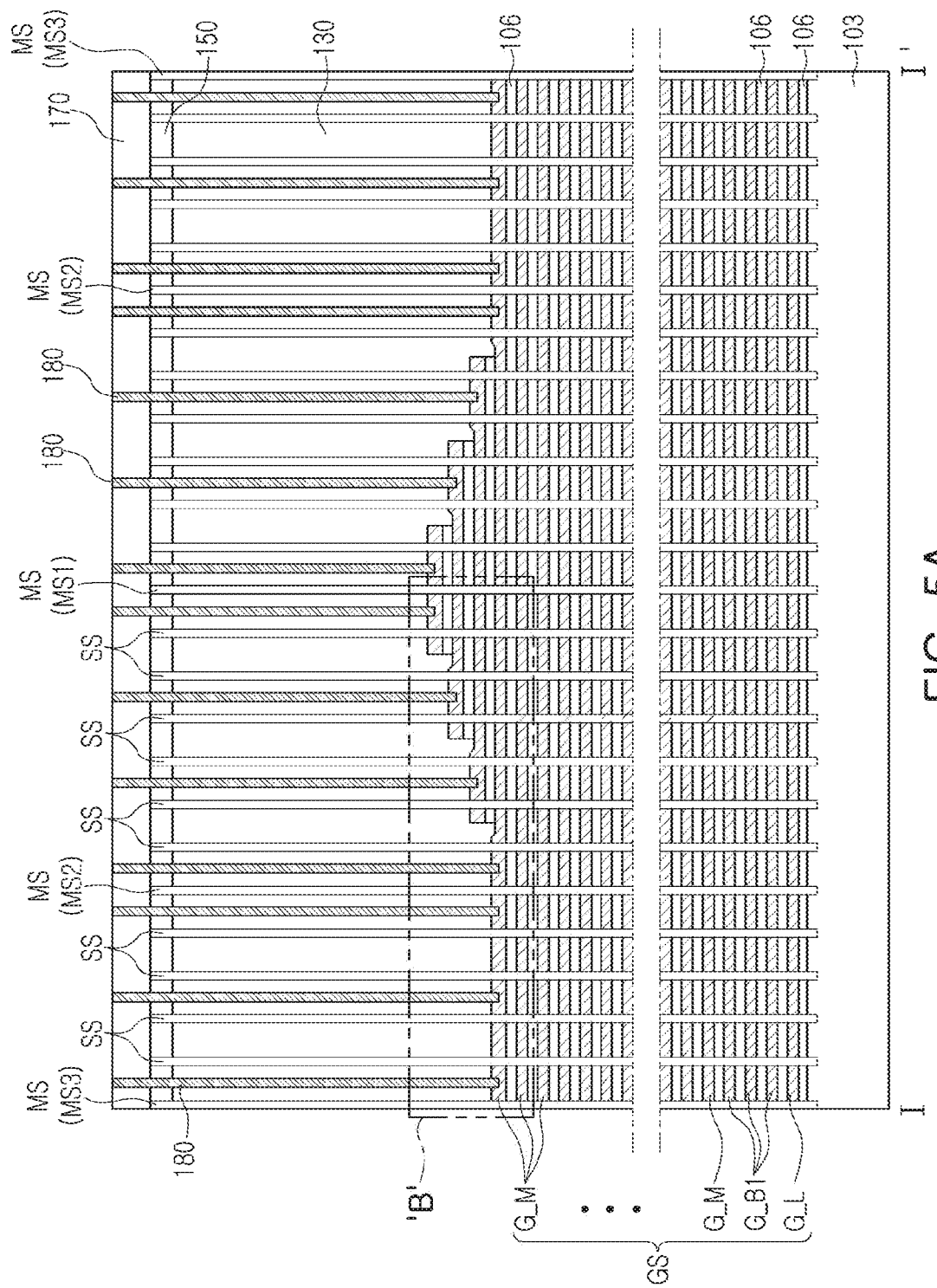

THREE-DIMENSIONAL SEMICONDUCTOR DEVICE HAVING A MEMORY BLOCK AND SEPARATION STRUCTURES

CROSS-REFERENCE TO RELATED APPLICATION(S)

This U.S. non-provisional application claims benefit of priority under 35 U.S.C. § 119 to Korean Patent Application No. 10-2018-0057306 filed on May 18, 2018 in the Korean Intellectual Property Office, the disclosure of which is incorporated by reference in its entirety herein.

BACKGROUND

1. Technical Field

Exemplary embodiments of the present inventive concept relate to a semiconductor device, and more particularly, to a three-dimensional semiconductor device including separation structures separating gates.

2. Discussion of Related Art

Semiconductor devices are electronic components that exploit the electronic properties of semiconductor materials. Semiconductor devices are manufactured both as single discrete devices and as integrated circuits (ICs), which may consist of numerous devices manufactured and interconnected on a single semiconductor substrate.

A metal-oxide-semiconductor field-effect transistor (MOSFET) is a widely used semiconductor device. The MOSFET includes a gate electrode charged to produce an electric field that controls the conductivity of a channel between two terminals, called the source and drain.

Semiconductor devices, including such gate electrodes stacked in directions perpendicular to surfaces of semiconductor substrates, have been developed. The number of stacked gate electrodes may be increased to obtain highly-integrated semiconductor devices. However, as the number of gate electrodes stacked in the direction perpendicular to surfaces of semiconductor substrates increases, so do the number unexpected defects.

SUMMARY

At least one embodiment of the present inventive concept provides a three-dimensional semiconductor device.

At least one embodiment of the present inventive concept provides a three-dimensional semiconductor device with high integration, and a method of forming the same.

According to an exemplary embodiment of the present inventive concept, a three-dimensional semiconductor device is provided. The three-dimensional semiconductor device includes first and second extended regions disposed on a substrate spaced apart from each other, a memory block disposed on the substrate between the first and second extended regions, and first and second main separation structures disposed on the substrate spaced apart from each other. The first extended region, the memory block and the second extended region are disposed between the first and second main separation structures. The memory block includes data storage regions and word lines. The word lines extend from the memory block and pass through the first and second extended regions. A distance between the first and second main separation structures located on both sides of the first extended region is greater than a distance between the first and second main separation structures located on both sides of the memory block.

According to an exemplary embodiment of the present inventive concept, a three-dimensional semiconductor device is provided. The three-dimensional semiconductor device includes a first main separation structure, a second main separation structure and a third main separation structure, disposed on a substrate, spaced apart from each other, a first stacked structure disposed on the substrate between the first main separation structure and the second main separation structure, and a second stacked structure disposed on the lower structure between the second main separation structure and the third main separation structure. The first and third main separation structures have linear shapes, parallel to each other. The second main separation structure is disposed between the first and third main separation structures. The second main separation structure includes a first portion and a second portion parallel to the first main separation structure and the third main separation structure. A distance between the second portion of the second main separation structure and the first main separation structure is greater than a distance between the first portion of the second main separation structure and the first main separation structure.

According to an exemplary embodiment of the present inventive concept, a three-dimensional semiconductor device is provided. The three-dimensional semiconductor device includes a first main separation structure and a second main separation structure disposed on a substrate; a first extended region, a second extended region and a memory block disposed between the first extended region and the second extended region, the first extended region, the second extended region, and the memory block disposed on the substrate, the first extended region, the second extended region and the memory block being disposed between the first and second main separation structures; a stacked structure including word lines stacked on one another and spaced apart from each other in a direction perpendicular to an upper surface of the substrate in the memory block, the word lines extending into the first extended region and the second extended region from an interior of the memory block; a channel semiconductor layer passing through the word lines in a direction perpendicular to the upper surface of the substrate in the memory block; and data storage regions disposed between the channel semiconductor layer and the word lines in the memory block. A width of the word lines in the memory block is less than a width of the word lines in the first extended region, and is greater than a width of the word lines in the second extended region.

According to an exemplary embodiment of the inventive concept, a three-dimensional semiconductor device is provided. The three-dimensional semiconductor device includes a substrate; first, second, and third separation structures disposed spaced apart from one another on the substrate; first and second extended regions disposed on the substrate between the first separation structure and the second separation structure; third and fourth extended regions disposed on the substrate between the second separation structure and the third separation structure; a first memory block disposed on the substrate between the first separation structure and the second separation structure and between the first and second extended regions; and a second memory block disposed on the substrate between the second separation structure and the third separation structure and between the third and fourth extended regions. The second separation structure is disposed between the first and third separation structures. The first and third separation structures have linear shapes. The second separation structure including first and second bent portions and a first linear portion between the bent portions. The first memory block includes word lines that extend into the first and second extended regions. The second memory block includes word lines that extend into the third and fourth extended regions.

BRIEF DESCRIPTION OF DRAWINGS

Exemplary embodiments of the present inventive concept will be more clearly understood from the following detailed description, taken in conjunction with the accompanying drawings, in which:

FIGS. 4A, 4B, 5A, 5B, 6A, 6B, 6C, 6D, 7A, 7B, 8A, 8B and 9 are drawings illustrating examples of a three-dimensional semiconductor device according to an exemplary embodiment of the present inventive concept;

DETAILED DESCRIPTION OF THE EXEMPLARY EMBODIMENTS

Figure 1A:
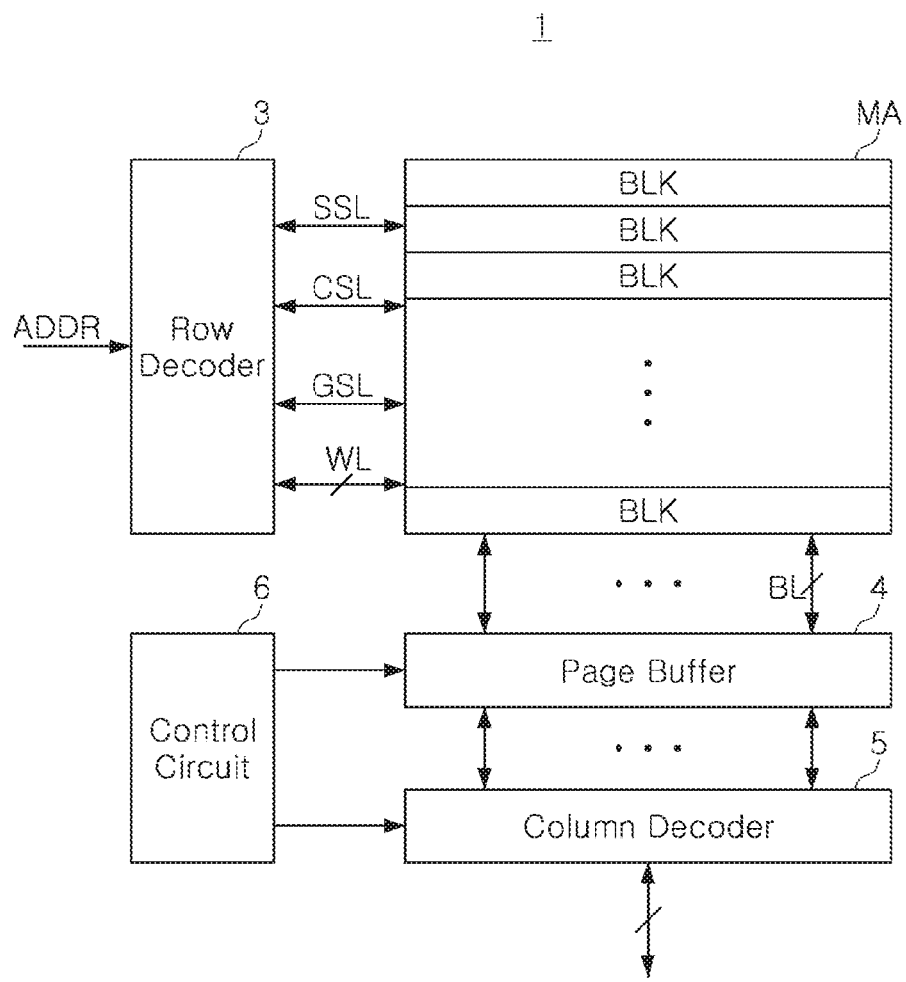
FIG. 1A is a schematic block diagram of a three-dimensional semiconductor device according to an exemplary embodiment of the present inventive concept.

An example of a three-dimensional semiconductor device according to an exemplary embodiment of the inventive concept will be described with reference to FIG. 1A. FIG. 1A is a schematic block diagram of a three-dimensional semiconductor device according to an exemplary embodiment of the inventive concept.

Referring to FIG. 1A, a three-dimensional semiconductor device 1 according to an exemplary embodiment includes a memory array region MA, a row decoder 3 (e.g., a row decoding circuit), a page buffer 4, a column decoder 5 (e.g., a column decoding circuit), and a control circuit 6. The memory array region MA includes a plurality of memory blocks BLK.

The memory array region MA may include memory cells arranged in a plurality of rows and columns. The memory cells included in the memory array region MA may be electrically connected to the row decoder 3 through word lines WL, at least one common source line CSL, string select lines SSL, at least one ground select line GSL, and may be electrically connected to the page buffer 4 and the column decoder 5 through bit lines BL.

In an exemplary embodiment, among the memory cells, memory cells arranged in a single row are connected to a single word line WL, and memory cells arranged in a single column are connected to a single bit line BL.

The row decoder 3 may be commonly connected to the memory blocks BLK, and may provide a driving signal to the word lines WL of the memory blocks BLK selected in response to a block select signal. For example, the row decoder 3 may receive address information ADDR an external source and decode the received address information ADDR. The row decoder 3 may use the decoded address to determine a voltage to supply to at least a portion of the word lines WL, the common source line CSL, the string select lines SSL, and the ground select line GSL, which are electrically connected to the memory blocks BLK.

The page buffer 4 may be electrically connected to the memory array region MA through the bit lines BL. The page buffer 4 may be connected to a bit line BL selected by an address decoded by the column decoder 5. The page buffer 4 may temporarily store data to be written in the memory cells, or may temporarily store data read from the memory cells, depending on an operating mode. For example, the page buffer 4 may operate as a writing driver circuit in a program operating mode, and may operate as a sense amplifier circuit in a reading operating mode. The page buffer 4 may receive power, for example, a voltage or a current, from the control circuit 6, and may provide the received power to the selected bit line BL.

The column decoder 5 may provide a data transmission path between the page buffer 4 and an external device, for example, a memory controller. The column decoder 5 may decode an externally input address to select one of the bit lines BL.

The column decoder 5 may be commonly connected to the memory blocks BLK, and may provide data information to the bit lines BL of the memory block BLK selected by a block select signal.

The control circuit 6 may control overall operations of the three-dimensional semiconductor device 1. The control circuit 6 may receive a control signal and an external voltage, and may operate in response to the received control signal. The control circuit 6 may include a voltage generator generating voltages, for example, a programming voltage, a reading voltage, and an erasing voltage required for internal operations, using an external voltage. The control circuit 6 may control reading, writing, and/or erasing operations in response to control signals.

Figure 1B:
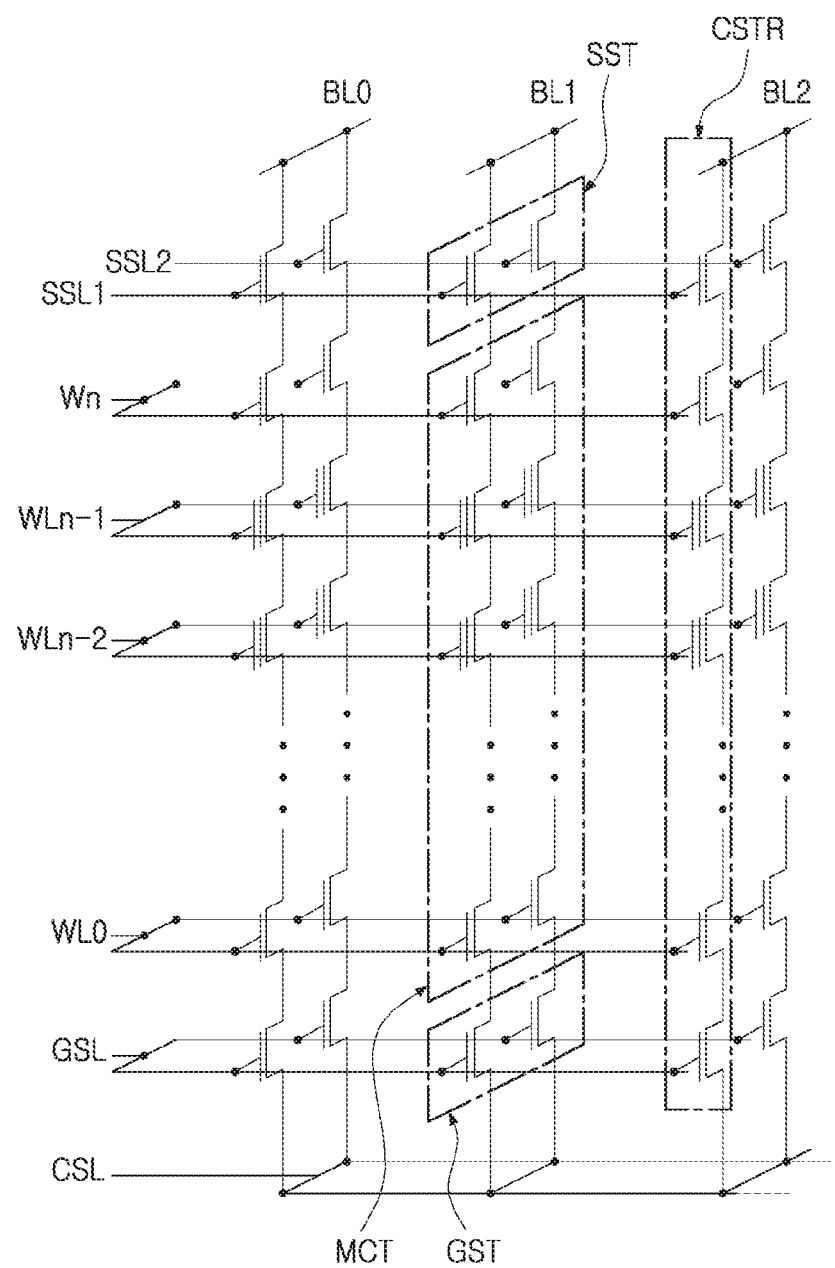
FIG. 1B is a circuit diagram conceptually illustrating a memory array region of a three-dimensional semiconductor device according to an exemplary embodiment of the present inventive concept.

An example of a circuit of the memory array region (see MA in FIG. 1A) of the three-dimensional semiconductor device 1 described above with reference to FIG. 1A will be described with reference to FIG. 1B. FIG. 1B is a circuit diagram conceptually illustrating the memory array region (see MA in FIG. 1A).

Referring to FIG. 1B, a three-dimensional semiconductor device according to an exemplary embodiment of the inventive concept includes a common source line CSL, bit lines BL0 to BL2, and a plurality of cell strings CSTR disposed between the common source line CSL and bit lines BL0 to BL2. The plurality of cell strings CSTR are connected to the respective bit lines BL0 to BL2 in parallel. The plurality of cell strings CSTR are connected to the common source line CSL in common. Each of the plurality of cell strings CSTR include a lower select transistor GST, memory cells MCT and an upper select transistor SST, which are connected in series.

The memory cells MCT are connected in series between the lower select transistor GST and the upper select transistor SST. Each of the memory cells MCT may include data storage regions in which information may be stored.

The upper select transistor SST may be electrically connected to the bit lines BL0 to BL2, and the lower select transistor GST may be electrically connected to the common source line CSL.

As the upper select transistor SST, a plurality of upper select transistors may be provided, and may be controlled by string select lines SSL1 and SSL2. The memory cells MCT are controlled by a plurality of word lines WL0 to WLn.

The lower select transistor GST is controlled by a ground select line GSL. The common source line CSL may be connected to a source of the ground select transistor GST in common.

In an example, the upper select transistor SST may be a string select transistor, and the lower select transistor GST may be a ground select transistor.

Figure 2:
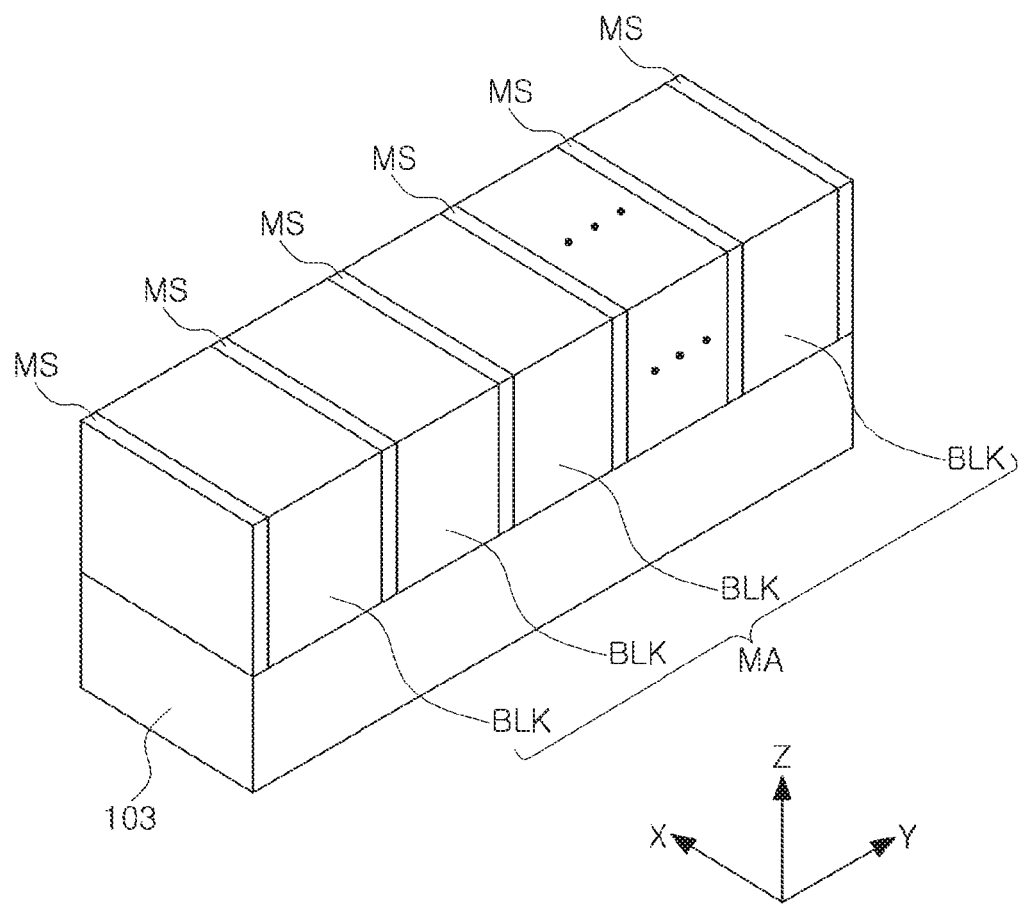
FIG. 2 is a schematic block diagram of a three-dimensional semiconductor device according to an exemplary embodiment of the present inventive concept.

FIG. 2 is a schematic block diagram of memory blocks BLK illustrated in FIG. 1, in a three-dimensional semiconductor device according to an exemplary embodiment of the inventive concept.

Referring to FIG. 2, the plurality of memory blocks BLK of the memory array region MA illustrated in FIG. 1 extend in a first direction X, and are sequentially arranged in a second direction Y. In an embodiment, the second direction Y is perpendicular to the first direction X.

The memory array region MA including the memory blocks BLK is disposed on a lower substructure 103. The memory blocks BLK are disposed between main separation structures MS disposed on the lower structure 103. Each of the memory blocks BLK is disposed between a pair of adjacent main separation structures MS. Thus, the memory blocks BLK are separated and spaced apart from each other in the second direction Y by the main separation structures MS.

Figure 3:
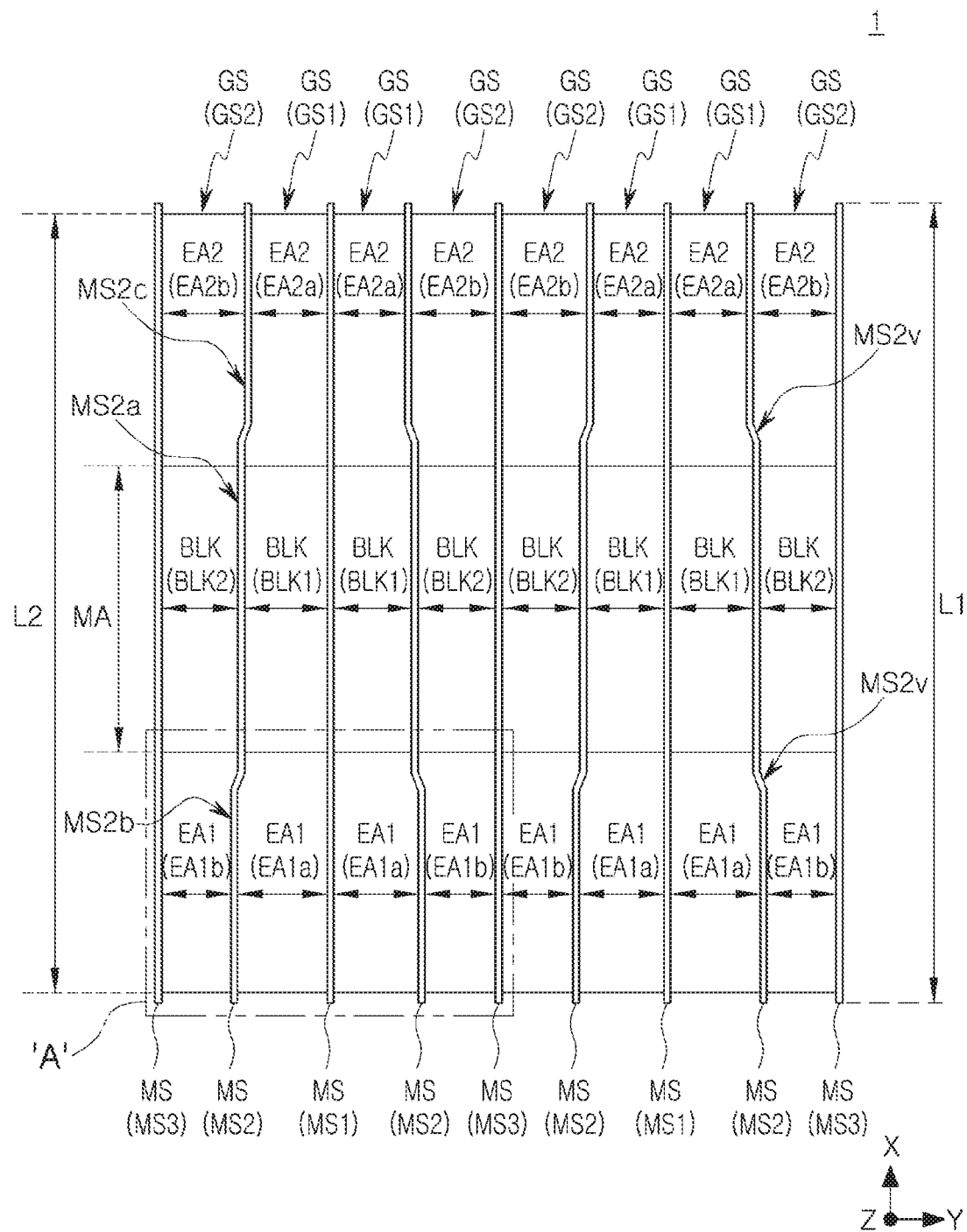
FIG. 3 is a schematic plan view of a three-dimensional semiconductor device according to an exemplary embodiment of the present inventive concept.

A three-dimensional semiconductor device according to an example embodiment of the inventive concept will be described with reference to FIG. 3 together with FIG. 2. FIG. 3 is a schematic plan view of a three-dimensional semiconductor device according to an exemplary embodiment of the inventive concept.

Referring to FIGS. 2 and 3, the memory array region MA includes the memory blocks MA separated from each other by the main separation structures MS in the second direction Y as illustrated in FIG. 2.

First extended regions EA1 are disposed on one sides of the memory blocks BLK, and second extended regions EA2 are disposed on the other sides of the memory blocks BLK. Thus, the memory blocks BLK are disposed between the first extended regions EA1 and the second extended regions EA2. The first extended regions EA1, the memory blocks BLK, and the second extended regions EA2 may be sequentially arranged in the first direction X.

The first extended regions EA1, the memory blocks BLK, and the second extended regions EA2 are disposed between the main separation structures MS. Thus, the first extended regions EA1 are spaced apart from each other in the second direction Y, similarly to the memory blocks BLK. In addition, the second extended regions EA2 are spaced apart from each other in the second direction Y, similarly to the memory blocks BLK.

Any one of the memory blocks BLK may be disposed between any one of the first extended regions and any one of the second extended regions. The memory blocks BLK may include a first memory block BLK1 and a second memory block BLK2.

The first extended regions EA1 include first extension regions EA1*a* and first reduction regions EA1*b*. The second extended regions EA2 include second extension regions EA2*b* and second reduction regions EA2*a*. The first memory block BLK1 is disposed between the first extension region EA1*a* of the first extended regions EA1 and the second reduction region EA2*a* of the second extended regions EA2. The second memory block BLK2 is disposed between the first reduction region EA1*b* of the first extended regions EA1 and the second extension region EA2*b* of the second extended regions EA2.

In an embodiment, the first extension region EA1*a* and the second extension region EA2*b* have the same or substantially the same size. For example, the first extension region EA1*a* and the second extension region EA2*b* have the same or substantially the same width in the second direction Y. In an embodiment, the first reduction region EA1*b* and the second reduction region EA2*a* have the same or substantially the same size. For example, the first reduction region EA1*b* and the second reduction region EA2*a* have the same or substantially the same width in the second direction Y. In an embodiment, the memory blocks BLK have the same or substantially the same size. For example, the memory blocks BLK have the same or substantially the same width in the second direction Y.

In an embodiment, a width of each of the memory blocks BLK in the second direction Y is less than a width of each of the first and second extension regions EA1*a* and EA2*b* in the second direction Y, and is greater than a width of each of the first and second reduction regions EA1*b* and EA2*a* in the second direction Y. In an embodiment, the width of each of the first and second extension regions EA1*a* and EA2*b* in the second direction Y is greater than the width of each of the first and second reduction regions EA1*b* and EA2*a* in the second direction Y.

The plurality of main separation structures MS include a first main separation structure MS1, second main separation structures MS2 and third main separation structures MS3. The second main separation structures MS2 are disposed on both sides of the first main separation structure MS1. The first and second main separation structures MS1 and MS2 are disposed between the third main separation structures MS3. The first to third main separation structures MS1 to MS3 described above, may be repeatedly arranged while being mirror-symmetrical in the second direction Y.

The first extension region EA1*a*, the first memory block BLK1 and the second reduction region EA2*a*, sequentially arranged in the first direction X, are disposed between one second main separation structure MS2 and the first main separation structure MS1 adjacent to each other. The first reduction region EA1*b*, the second memory block BLK2 and the second extension region EA2*b*, sequentially arranged in the first direction X, are disposed between one second main separation structure MS2 and one third main separation structure MS3 adjacent to each other.

Thus, when viewed from above as illustrated in the plan view of FIG. 3, the first extended regions EA1 include one first reduction region EA1*b*, one first extension region EA1*a*, one first extension region EA1*a*, and one first reduction region EA1*b*, sequentially arranged in the second direction Y, between two third main separation structures MS3. Similarly thereto, when viewed from above as illustrated in the plan view of FIG. 3, the second extended regions EA2 include one second extension region EA2*b*, one second reduction region EA2*a*, one second reduction region EA2*a* and one second extension region EA2*b*, sequentially arranged in the second direction Y in the second direction Y, between two third main separation structures MS3.

A distance between the plurality of main separation structures MS may be determined by the width of each of the memory blocks BLK in the second direction Y, the width of each of the first and second extension regions EA1*a* and EA2*b* in the second direction Y, and the width of each of the first and second reduction regions EA1*b* and EA2*a* in the second direction Y. Thus, in an embodiment, between the first and second main separation structures MS1 and MS2 adjacent to each other, a separation distance between the first main separation structure MS1 and the second main separation structure MS2 located on both sides of the first memory block BLK1 is less than a separation distance between the first main separation structure MS1 and the second main separation structure MS2 located on both sides of the first extension region EA1*a* of the first extended region EA1, and is greater than a separation distance between the first main separation structure MS1 and the second main separation structure MS2 located on both sides of the second reduction region EA2*a* of the second extended region EA2. In an embodiment, a separation distance between the first main separation structure MS1 and the second main separation structure MS2 located on both sides of the first extension region EA1*a* of the first extended region EA1 is greater than a separation distance between the first main separation structure MS1 and the second main separation structure MS2 located on both sides of the second reduction region EA2*a* of the second extended region EA2.

Between the second and third main separation structures MS2 and MS3 adjacent to each other, a separation distance between the second main separation structure MS2 and the third main separation structure MS3 located on both sides of the second memory block BLK2 is greater than a separation distance between the second main separation structure MS2 and the third main separation structure MS3 located on both sides of the first reduction region EA1*b* of the first extended region EA1, and is less than a separation distance between the second main separation structure MS2 and the third main separation structure MS3 located on both sides of the second extension region EA2*b* of the second extended region EA2. In an embodiment, a separation distance between the second main separation structure MS2 and the third main separation structure MS3 located on both sides of the first reduction region EA1*b* of the first extended region EA1 is less than a separation distance between the second main separation structure MS2 and the third main separation structure MS3 located on both sides of the second extension region EA2*b* of the second extended region EA2.

The separation distances between the main separation structures MS as described above may be changed by bent portions MS2*v* of the second main separation structures MS2. For example, each of the second main separation structures MS2 includes a first portion MS2*a*, a second portion MS2*b*, and a third portion MS2*c*. The first memory blocks BLK1 are disposed between first portions MS2*a* of the second main separation structures MS2 and the first main separation structure MS1. The first extension region EA1*a* of the first extended region EA1 is disposed between the second portions MS2*b* of the second main separation structures MS2 and the first main separation structure MS1. The first reduction region EA2*a* of the second extended region EA2 is disposed between third portions MS2*c* of the second main separation structures MS2 and the first main separation structure MS1. In an embodiment of the second main separation structures MS2, the bent portions MS2*v* are disposed between the first portions MS2*a* and the second portions MS2*b* and between the first portions MS2*a* and the third portions MS2*c*.

For example, the second portion MS2*b* of the second main separation structure MS2 and the first main separation structure MS1, located on both sides of the first extension region EA1*a*, may be maintained to have a predetermined distance therebetween, and a distance between the first portion MS2*a* of the second main separation structure MS2 and the first main separation structure MS1 located on both sides of the first memory block BLK1 in a direction (e.g., in the first direction) from the first extension region EA1*a* toward the first memory block BLK1 may be narrowed. In this case, the first main separation structure MS1 may extend to have a straight, linear form in the first direction X, and the second main separation structure MS2 may extend while being bent to be adjacent to the first main separation structure MS1, in such a manner that a distance thereof between the second main separation structure MS2 and the first main separation structure MS1 is reduced. Thus, in the second main separation structure MS2, a portion bent between the first portion MS2*a* and the second portion MS2*b* may be defined as the bent portion MS2*v*.

In an embodiment, stacked structures GS are disposed between the plurality of main separation structures MS. In an embodiment, each of the stacked structures GS is disposed between one pair of main separation structures MS adjacent to each other, among the plurality of main separation structures MS.

The stacked structures GS include first stacked structures GS1 disposed between any one of the second main separation structures MS2 and the first main separation structure MS1, adjacent to each other, and second stacked structures GS2 disposed between any one of the second main separation structures MS2 and any one of the third main separation structures MS3, adjacent to each other.

In an embodiment, a length L1 of each of the plurality of main separation structures MS in the first direction X is greater than a length L2 of each of the stacked structures GS in the first direction X.

Figure 4A:
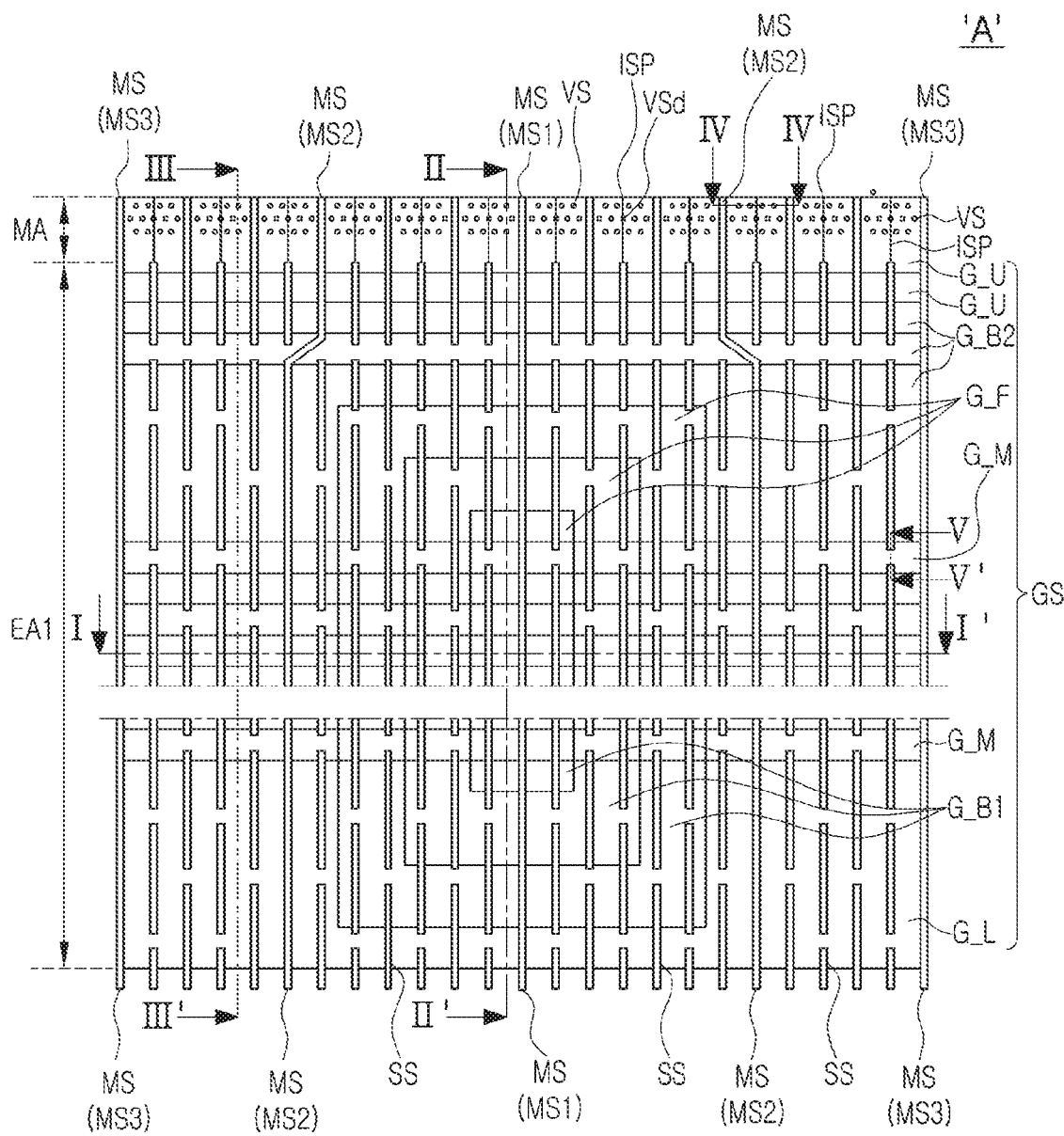
Figure 4B:
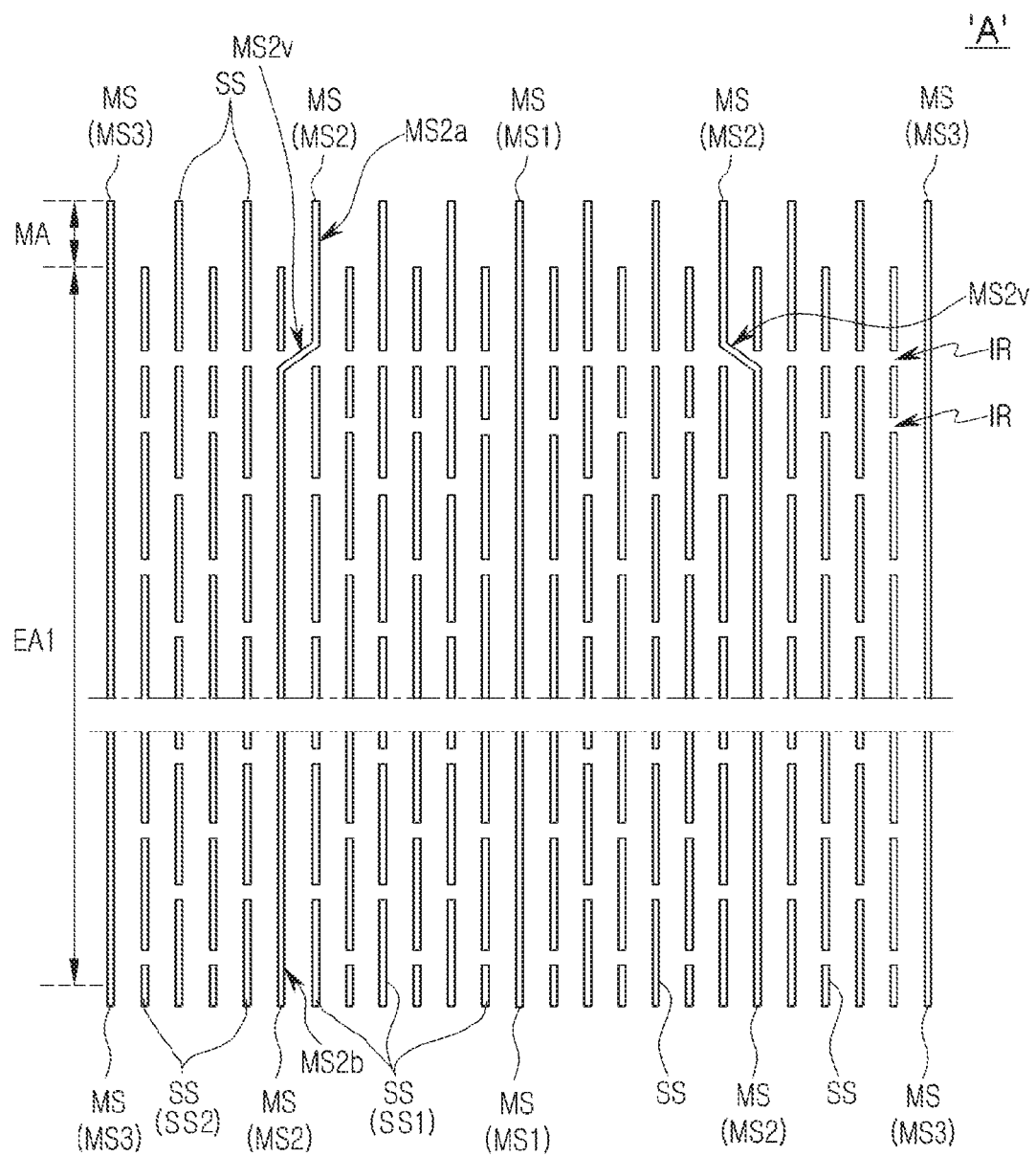
Figure 5B:
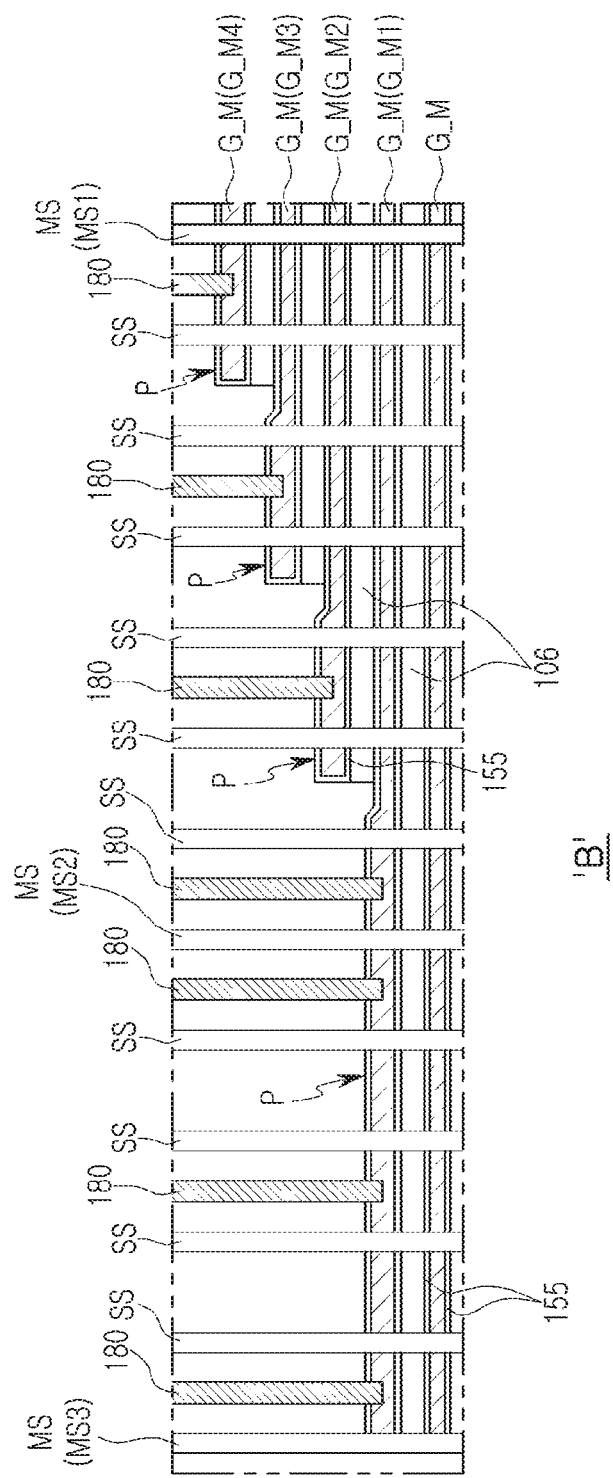
Figure 6A:
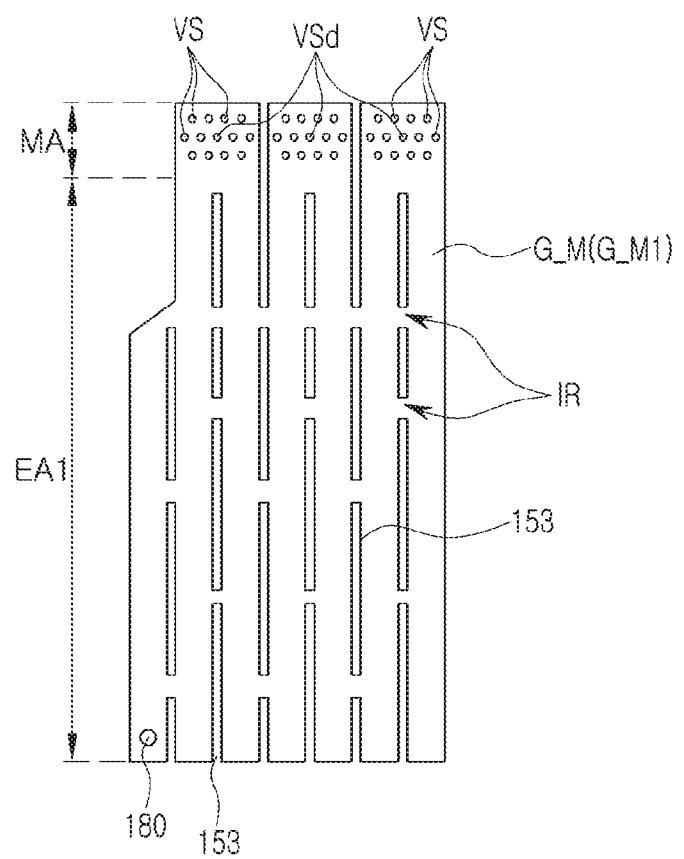
Figure 6B:
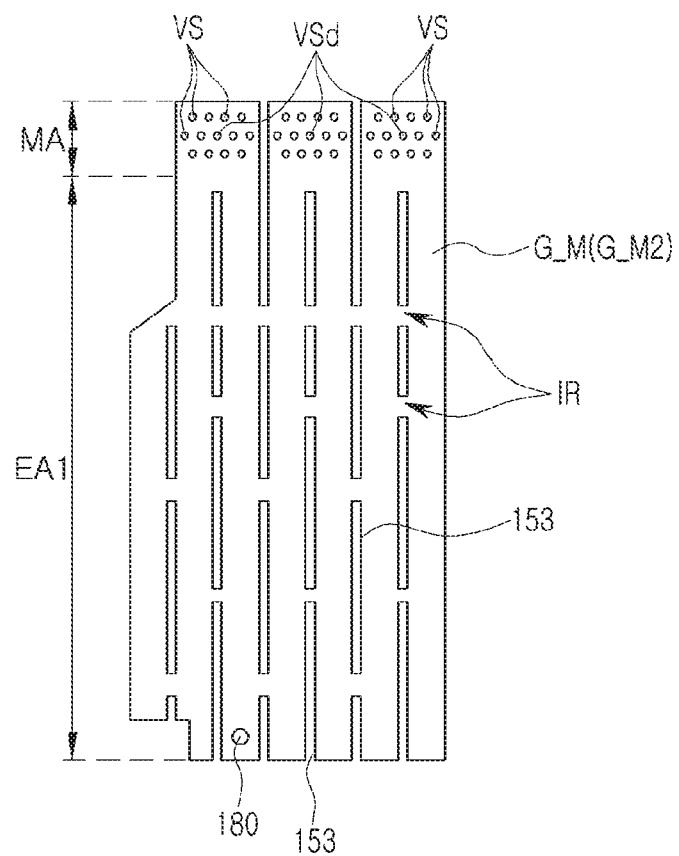
Figure 6C:
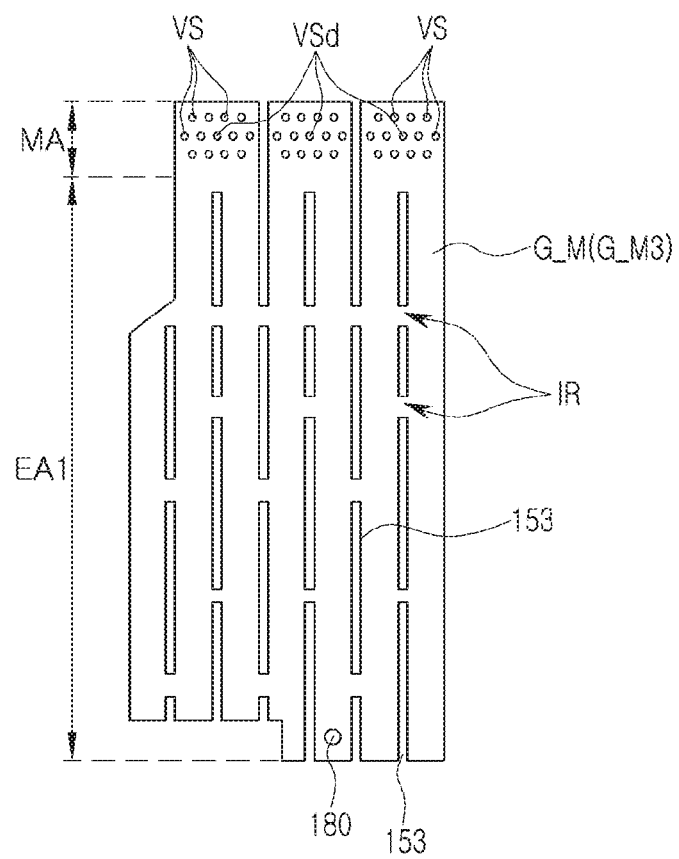
Figure 6D:
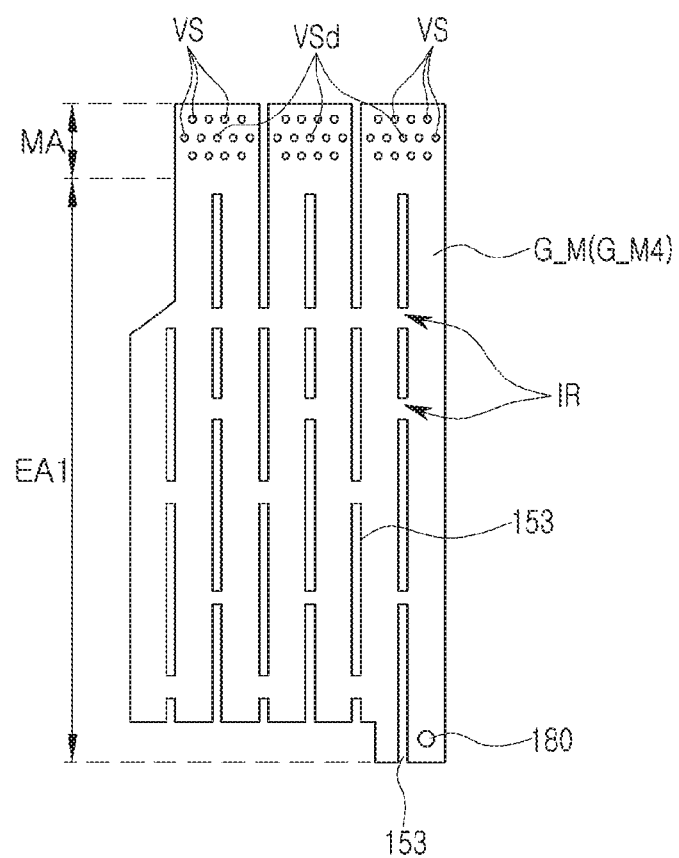
Figure 7A:
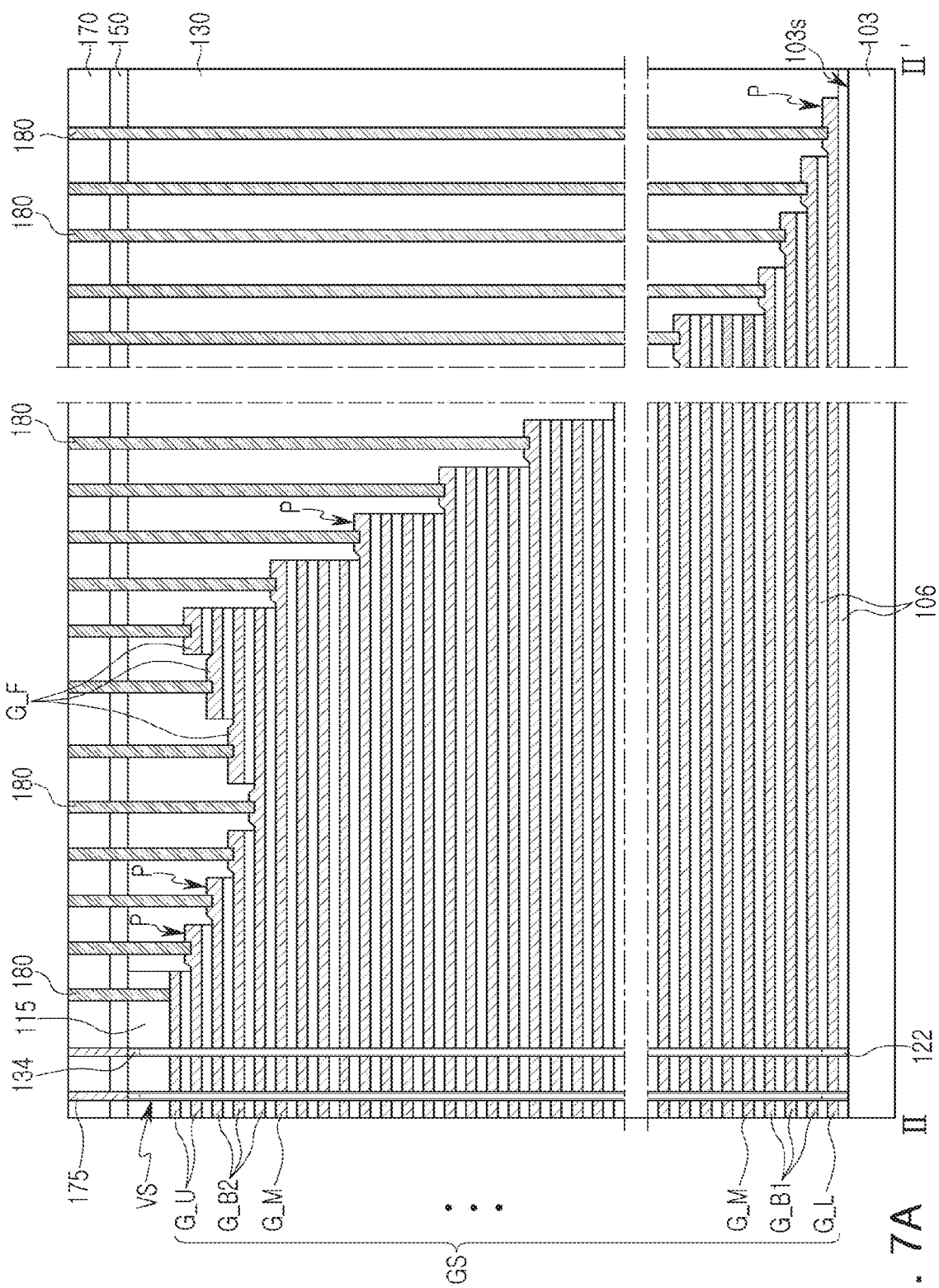
Figure 7B:
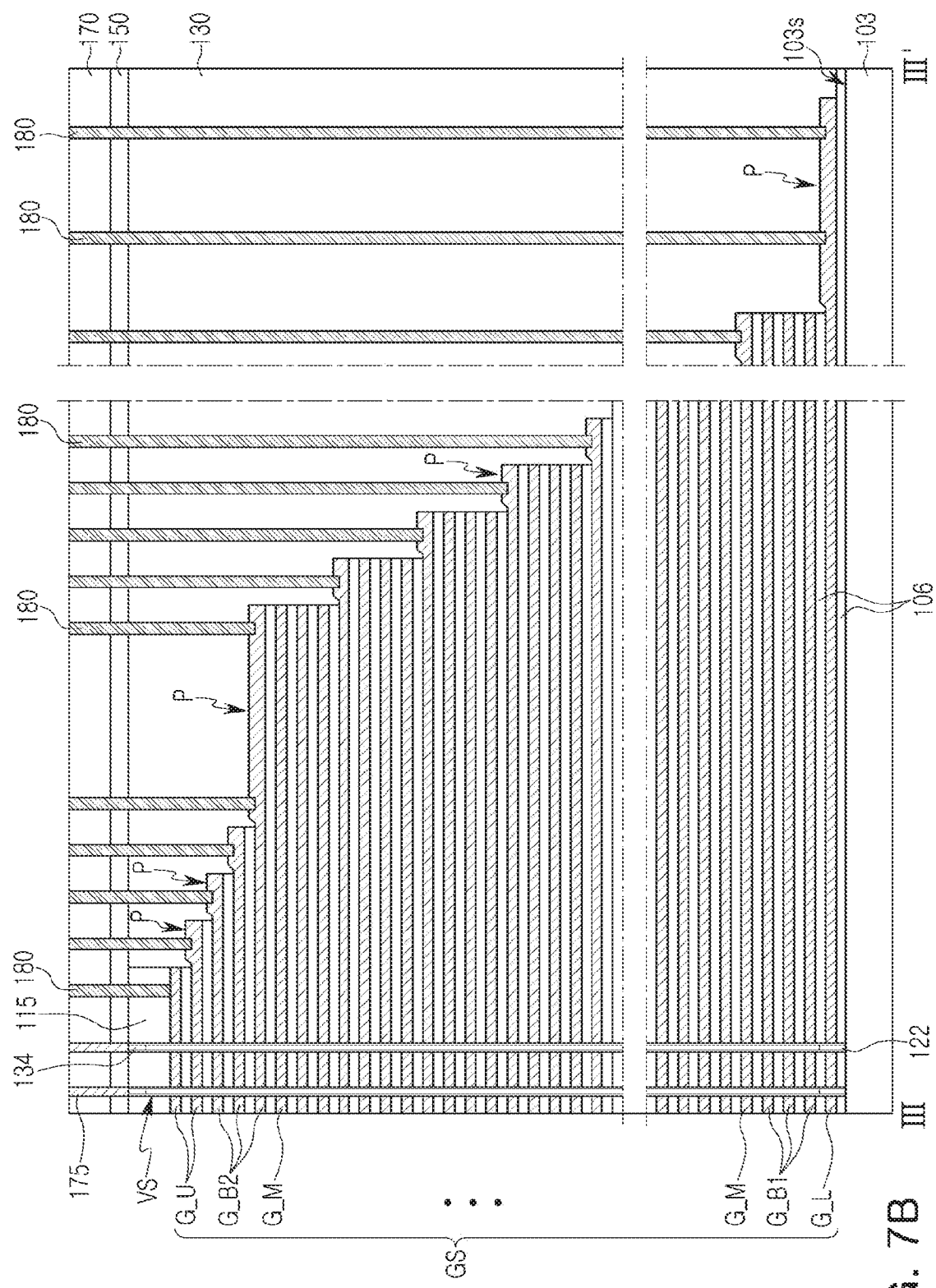
Figure 8A:
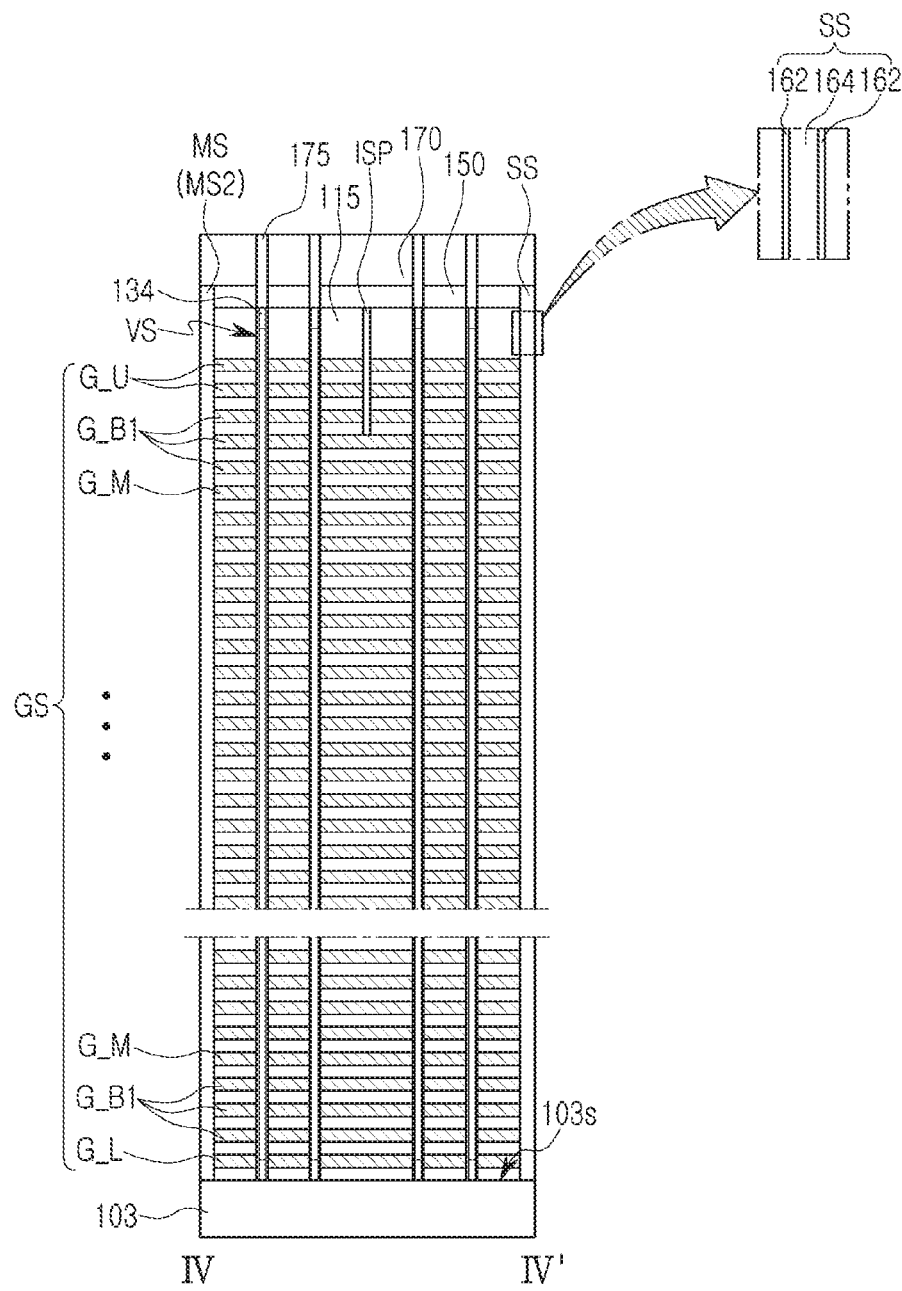
Figure 8B:
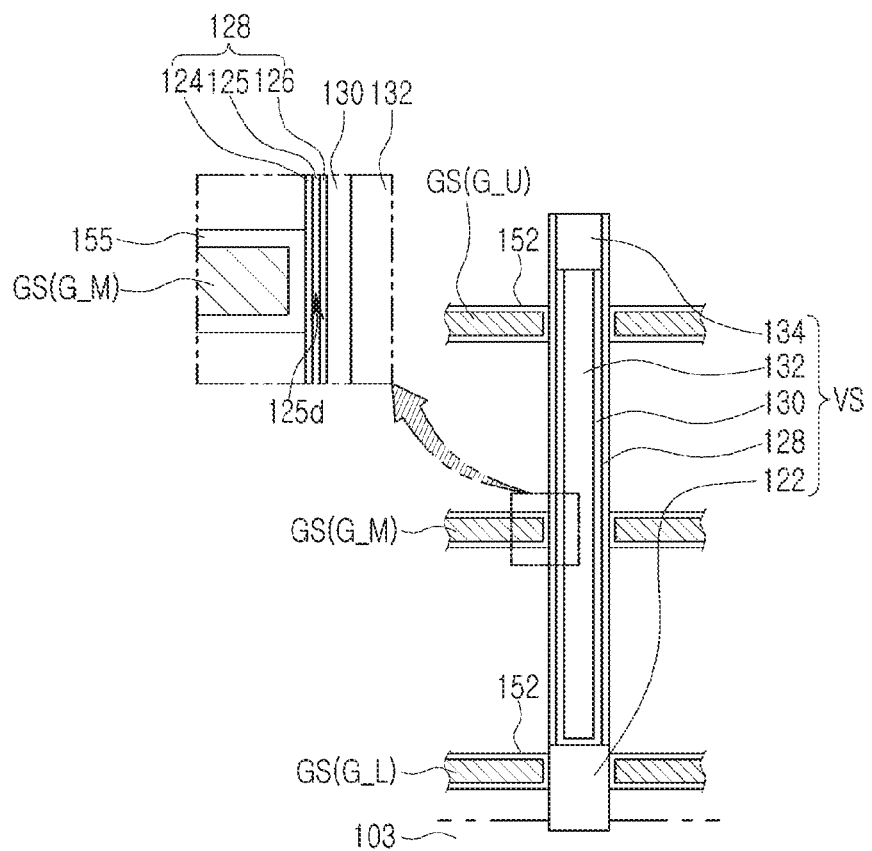
Figure 9:
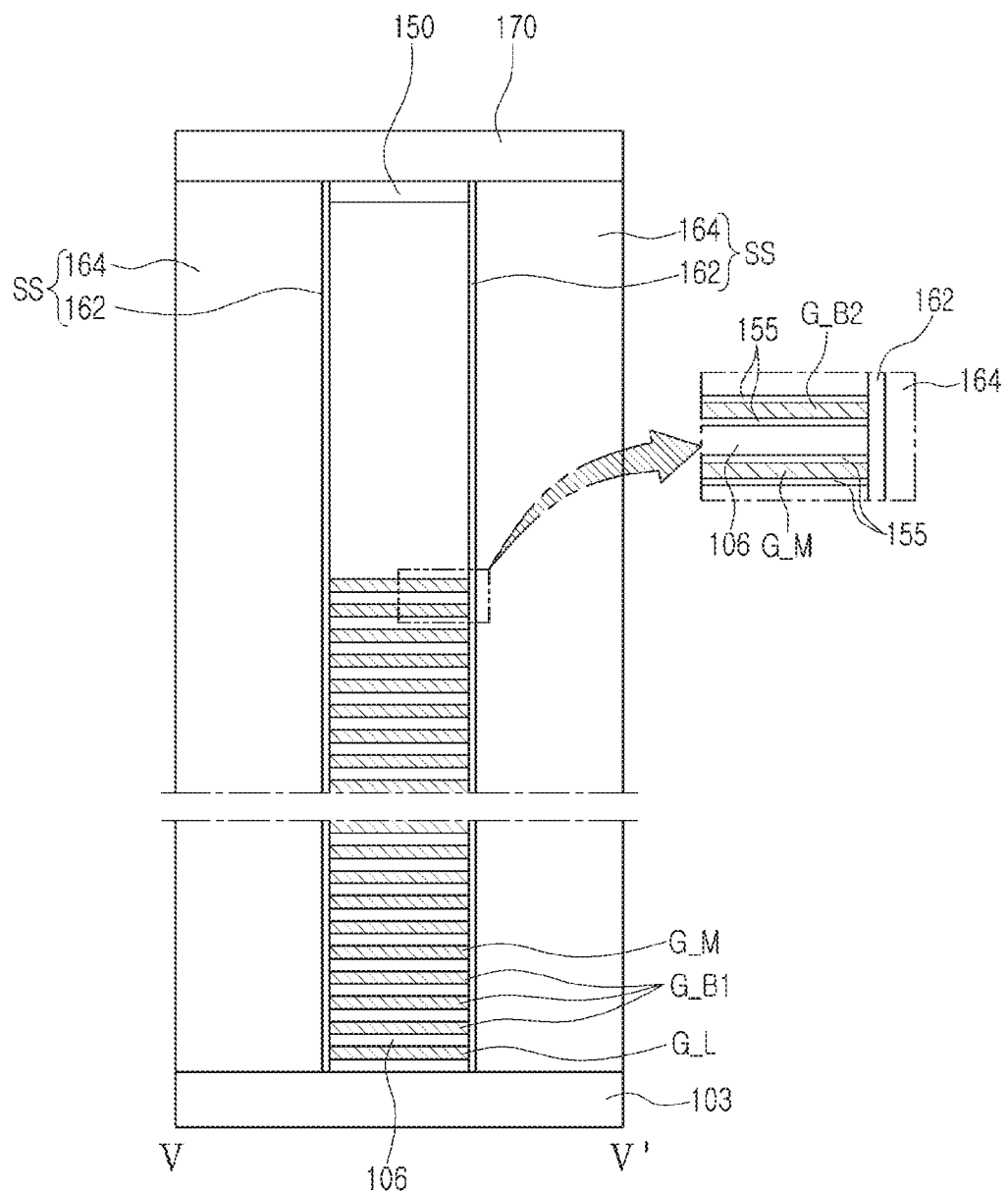

An example of a three-dimensional semiconductor device according to an exemplary embodiment is discussed below with reference to FIGS. 4A, 4B, 5A, 5B, 6A, 6B, 6C, 6D, 7A, 7B, 8A, 8B and 9. FIG. 4A is an enlarged plan view of portion A of FIG. 3. FIG. 4B is a plan view illustrating portions of components of FIG. 4A. FIG. 5A is a cross-sectional view illustrating a region taken along line I-I' of FIG. 4A. FIG. 5B is a partially enlarged view illustrating portion 'B' of FIG. 5A. FIGS. 6A to 6D are plan views illustrating word lines of FIG. 5B stacked sequentially. FIG. 7A is a cross-sectional view of a region taken along line II-II' of FIG. 4A. FIG. 7B is a cross-sectional view of a region taken along line III-III' of FIG. 4A. FIG. 8A is a cross-sectional view illustrating a region taken along line IV-IV' of FIG. 4A. FIG. 8B is a cross-sectional view conceptually illustrating portions of components of FIG. 8A. FIG. 9 is a cross-sectional view illustrating a region taken along line V-V' of FIG. 4A.

The descriptions with respect to FIGS. 4A, 4B, 5A, 5B, 6A, 6B, 6C, 6D, 7A, 7B, 8A, 8B and 9 will be provided below, together with descriptions with respect to FIGS. 2 and 3, while referring to portions of FIGS. 2 to 9 as needed.

Referring to FIGS. 2 to 9, the main separation structures MS and the stacked structures GS are disposed on the lower structure 103, as described above with reference to FIGS. 2 and 3. In an embodiment, auxiliary separation structures SS are disposed on the lower structure 103. The auxiliary separation structures SS may have a linear shape or a bar shape extending in the first direction X. In an embodiment, the lower structure 103 is a semiconductor substrate that is formed of a semiconductor material such as silicon.

In an embodiment, a length of each of the auxiliary separation structures SS in the first direction X is less than the length L1 (see FIG. 3) of each of the main separation structures MS in the first direction X.

In an embodiment, the auxiliary separation structures SS have end portions arranged in the first direction X and facing each other in the first direction X. Gaps between the end portions of the auxiliary separation structures SS, facing each other, in the first direction X, may be defined as connection regions IR.

In an example, the connection regions IR are arranged in a zigzag form.

In an embodiment, the auxiliary separation structures SS are disposed between the main separation structures MS.

Referring to FIGS. 5A, 5B, 7A, 7B and 8A, each of the stacked structures GS include gate electrodes G_L, G_B1, G_M, G_B2 and G_U stacked while being spaced apart from each other, in a direction perpendicular to an upper surface 103s of the lower structure 103. Interlayer insulating layers 106 may be disposed between the gate electrodes G_L, G_B1, G_M, G_B2 and G_U. The interlayer insulating layer 106 may also be disposed between a lowermost gate electrode G_L, among the gate electrodes G_L, G_B1, G_M, G_B2 and G_U, and the lower structure 103. The gate electrodes G_L, G_B1, G_M, G_B2 and G_U may be formed of a conductive material including at least one of a doped polysilicon, a metal nitride such as Titanium Nitride TiN, a metal silicide such as Tungsten Silicide WSi, Titanium Silicide TiSi, or Tantalum Silicide TaSi, or a metal such as Tungsten W. The doped polysilicon may be polysilicon including an N-type impurity such as phosphorus (P) or arsenic (As), or a P-type impurity such as boron (B).

In an embodiment, each of the stacked structures GS include one or a plurality of lower gate electrodes G_L and G_B1, and a plurality of intermediate gate electrodes G_M disposed on the one or more lower gate electrodes G_L and G_B1, and one or a plurality of upper gate electrodes G_B2 and G_U disposed on the plurality of intermediate gate electrodes G_M.

In an example, one or more gate electrodes is provided as the one or the plurality of lower gate electrodes G_L and G_B1. The plurality of lower gate electrodes G_L and G_B1 may include a lower select gate electrode G_L and one or a plurality of lower buffer gate electrodes G_B1 disposed on the lower select gate electrode G_L. In an embodiment, the lower select gate electrode G_L is the ground select line (GSL in FIGS. 1A and 1B) described above with reference to FIGS. 1A and 1B. In another embodiment, a lower buffer gate electrode located in a relatively low position, among the one or plurality of lower buffer gate electrodes G_B1, is used as the ground select line (GSL in FIGS. 1A and 1B).

In an exemplary embodiment, the plurality of intermediate gate electrodes G_M are word lines (WL in FIG. 1A and WL0 to WLn in FIG. 1B) described above with reference to FIGS. 1A and 1B.

In an example, one or more upper gate electrodes is provided as the one or the plurality of upper gate electrodes G_B2 and G_U. Among the plurality of upper gate electrodes G_B2 and G_U, an uppermost upper gate electrode and/or a next upper gate electrode may be an upper select gate electrode G_U, and one or a plurality of upper gate electrodes disposed between the upper select gate electrode G_U and the plurality of intermediate gate electrodes may be upper buffer gate electrodes G_B2. In an embodiment, the upper select gate electrode G_U is one of the string select lines (SSL in FIG. 1 and SSL1 to SSL2 in FIG. 2) described above with reference to FIGS. 1A and 1B. In another example, an upper buffer gate electrode located in a relatively low position, among the upper buffer gate electrodes G_B2, may be used as the word line described above.

In an embodiment, a capping insulating layer 115 is disposed on the upper select gate electrode G_U of the stacked structures GS.

In an embodiment, insulating patterns ISP, for division of the upper select gate electrode G_U in the second direction Y, are disposed. The insulating patterns ISP may be disposed in a position higher than a position of the intermediate gate electrodes G_M. The insulating patterns ISP may extend in the first direction X, while penetrating through the capping insulating layer 115 and the upper select gate electrode G_U, to traverse the upper select gate electrode G_U, thereby dividing the upper select gate electrode G_U in the second direction Y. Similarly thereto, portions of the auxiliary separation structures SS may divide the upper select gate electrode G_U into a plurality of regions in the second direction Y while traversing the upper select gate electrode G_U. Thus, between two adjacent main separation structures MS, for example, between the first main separation structure MS1 and the second main separation structure MS2, the upper select gate electrode G_U may be separated into a plurality of regions by the auxiliary separation structures SS and the insulating patterns ISP in the second direction Y.

In an embodiment, the main separation structures MS penetrate through the stacked structures GS in a vertical direction, and extend in the first direction X to divide the stacked structures GS into the first and second stacked structures GS1 and GS2 similar to those described above with reference to FIG. 3. As described with respect to FIG. 3, in an embodiment, the length L1 of each of the main separation structures MS in the first direction X is greater than the length L2 of each of the stacked structures GS in the first direction X.

The gate electrodes G_L, G_B1, G_M, G_B2 and G_U of the stacked structures GS may be spaced apart from each other while being sequentially stacked in the memory blocks BLK of the memory array region MA in the vertical direction, and may extend from the memory blocks BLK to the first extended region EA1 and the second extended region EA2.

Referring to FIG. 7A, in the first and second extension regions EA1a and EA2b of the first extended region EA1 and the second extended region EA2, floating dummy gate electrodes G_F are disposed on the plurality of intermediate gate electrodes G_M, to face a portion of the upper gate electrodes G_U and G_B2. In an embodiment, the floating dummy gate electrodes G_F are formed of the same material as that of the gate electrodes G_L, G_B1, G_M, G_B2 and G_U. In an embodiment, the floating dummy gate electrodes G_F include pads P arranged in a stepped shape sequentially lowered in a direction toward the upper gate electrodes G_U and G_B2.

The gate electrodes G_L, G_B1, G_M, G_B2 and G_U may have pads P arranged in a stepped shape in the first extended region EA1 and the second extended region EA2. Among the gate electrodes G_L, G_B1, G_M, G_B2 and G_U, portions thereof located in the first extended region EA1 and the second extended region EA2 and not overlapped with a gate electrode located in a relatively high upper position, may be defined as the pads.

In an exemplary embodiment, the first and second extension regions EA1a and EA2b have the same structure or a mirror-symmetrical structure. Thus, from one of the first and second extension regions EA1a and EA2a, a structure of the remaining extension region may be determined. In an exemplary embodiment, the first and second reduction regions EA1b and EA2b have the same structure or a mirror-symmetrical structure. Hereinafter, referring mainly to FIGS. 3, 4A, 5A, 5B, 7A and 7B, together with the description of the form of arrangement of pads P arranged in the first extended regions EA1 and the first extension regions EA1a disposed between the first main separation structure MS1 and the second main separation structure MS2 (e.g., the shape of arrangement of the pads P in the first extended regions EA1 located on both sides of the first main separation structure MS1); mainly the arrangement form of pads P arranged in the first extended region EA1 and the first reduction region EA1b disposed between the second main separation structure MS2 and the third main separation structure MS3 will be described.

Referring to FIGS. 3, 4A and 7A, in an embodiment, pads P of the upper gate electrodes G_U and G_B2 are arranged in a stepped shape, gradually lowered by a first step height in a direction from the first memory block BLK1 to the first extended region EA1. In an embodiment, pads P of the intermediate gate electrodes G_M are arranged in a stepped shape gradually lowered by a second step height in a direction away from the first memory block BLK1 in the first extension region EA1a. In an embodiment, pads P of the lower gate electrodes G_L and G_B1 are arranged in a stepped shape, gradually lowered by the first step height in the direction away from the first memory block BLK1 in the first extension region EA1a.

Referring to FIGS. 3, 4A and 7B, in an embodiment, the pads P of the upper gate electrodes G_U and G_B2 are arranged in a stepped shape, gradually lowered by the first step height in a direction (e.g., in the first direction X) from the second memory block BLK2 to the first extended region EA1. In an embodiment, the pads P of the intermediate gate electrodes G_M are arranged in a stepped shape, gradually lowered by a second step height greater than the first step height in a direction away from the second memory block BLK2 in the first reduction region EA1b. In an embodiment, the pads P of the lower gate electrodes G_L and G_B1 are lowered by the second step height in a direction (e.g., in the first direction X) away from the first memory block BLK1 in the first reduction region EA1b, and the pad P of a lowermost lower gate electrode G_L from among the lower gate electrodes G_L and G_B1 may be exposed.

Referring to FIGS. 3, 4A, 5A and 5B, in an embodiment, in the first extension region EA1a, the pads P of the intermediate gate electrodes G_M are arranged in a stepped shape, gradually lowered by the first step height in a direction (e.g., in the second direction Y) from the first extension region EA1a to the first reduction region EA1b. The first extension region EA1a may be disposed on both sides of the first main separation structure MS1. Thus, the first extension regions EA1a may be formed to have a mirror-symmetrical structure, with the first main separation structure MS1 as a center. Thus, in the first extension regions EA1a, the pads P of the intermediate gate electrodes G_M may be arranged in a stepped shape, lowered by the first step height in a direction toward the second main separation structures MS2, with the first main separation structure MS1 as a center.

In an embodiment, the pads P of the intermediate gate electrodes G_M are arranged in a stepped shape lowered by the first step height in a direction (e.g., the second direction Y) from the first extension region EA1a to the first reduction region EA1b. Lowermost pads, among the pads P of the intermediate gate electrodes G_M lowered by the first step height in the second direction Y, may extend in the first reduction region EA1b. Thus, in the first reduction region EA1b, the pads P of the intermediate gate electrodes G_M may be formed as flat pads, other than being arranged in a stepped shape in the second direction Y.

Referring to FIGS. 3, 4A, 5A, 5B, 7A and 7B, in an embodiment, the intermediate gate electrodes G_M include pads P in a number corresponding to the number of the intermediate gate electrodes G_M stacked in the first extension region EA1a. In an embodiment, the intermediate gate electrodes G_M include pads P in a number less than the number of the stacked intermediate gate electrodes G_M in the first reduction region EA1b. Thus, the intermediate gate electrodes G_M of the first stacked structure GS1 may include pads in a number corresponding to the number of the stacked intermediate gate electrodes G_M in the first extension region EA1a, and may include pads in a number less than the number of the stacked intermediate gate electrodes G_M in the second reduction region EA2a. In an embodiment, the intermediate gate electrodes G_M of the second stacked structure GS2 include pads P in a number corresponding to the number of stacked intermediate gate electrodes G_M in the second extension region EA2b, and include pads P in a number less than the number of stacked intermediate gate electrodes G_M in the first reduction region EA1b.

In an embodiment, a first insulating layer 130 is disposed to cover the stacked structure GS, does not overlap with the first capping insulating layer 115, and has an upper surface substantially identical, for example, coplanar with an upper surface of the first capping insulating layer 115. The first insulating layer 130, a second insulating layer 150 covering the first capping insulating layer 115, and a third insulating layer 170 may be sequentially disposed.

In an embodiment, contact plugs 180 are disposed on the pads P of the gate electrodes G_L, G_B1, G_M, G_B2 and G_U. In an embodiment, the contact plugs 180 extend in the vertical direction, while contacting the pads P, to penetrate through the third insulating layer 170.

Among the contact plugs 180, contact plugs 180, connected to the pads P of the upper select gate electrode G_U, which may be used as the string select lines (see SSL in FIG. 1 and SSL1 to SSL2 in FIG. 2), the pads P of the plurality of intermediate gate electrodes G_M, which may be used as the word lines (see WL in FIG. 1A and WL0 to WLn in FIG. 1B), and the pad P of the lower select gate electrode G_L, which may be used as the ground select line (see GSL of FIGS. 1A and 1B), may be active contact plugs to which electrical signals are applied, and the remaining contact plugs may be dummy contact plugs.

Referring to FIGS. 3, 4A, 5A, 5B and 6A to 6D as described above, in an embodiment, in the first extension region EA1*a*, the pads P of the intermediate gate electrodes G_M are arranged in a stepped shape, gradually lowered by the first step height, in a direction (e.g., in the second direction Y) from the first extension region EA1*a* to the first reduction region EA1*b*.

In an embodiment, the intermediate gate electrodes G_M includes a first word line G_M1, a second word line G_M2, a third word line G_M3, and a fourth word line G_M4, stacked sequentially.

The first to fourth word lines G_M1 to G_M4 may be stacked while being spaced apart from each other in the first memory block BLK1 in the vertical direction, and may include pads P arranged in a stepped shape while extending into the first extended region EA1 from the first memory block BLK1. In an embodiment, the first to fourth word lines G_M1 to G_M4 include the pads P arranged in a stepped shape gradually lowered by the first step height in a direction from the first extension region EA1*a* to the first reduction region EA1*b*.

In an embodiment of the first to fourth word lines G_M1 to G_M4, each width thereof in the second direction Y in the first extension region EA1*a* is greater than each width thereof in the second direction Y in the first memory block BLK1.

Similarly, in an embodiment of the stacked structures GS including the first to fourth word lines G_M1 to G_M4, a width of each of the stacked structures GS in the second direction Y in the extension region EA1*a* is greater than a width of each of the stacked structures GS in the second direction Y in the first memory block BLK1. For, example, the width of the word lines in the first memory block BLK may be less than the width of the word lines in the extension region EA1*a*. In an amendment, a width of each of the stacked structures GS in the second direction Y in the second reduction region EA2*a* is less than a width thereof in the second direction Y in the first memory block BLK1. For example, a width of the word lines in the first memory block BLK1 is greater than a width of the word lines in the second reduction region EA2. In an embodiment, the width of the stacked structures GS in the second direction Y in the first extension region EA1*a* is greater than the width of the stacked structures GS in the second direction Y in the second reduction region EA2*a*. For example, a width of the word lines in the first extension region EA1*a* is greater than a width of the word lines in the second reduction region EA2*a*. In FIGS. 6A to 6D, reference numeral 153 denotes regions in which the auxiliary separation structures SS passing through the first to fourth word lines G_M1 to G_M4 are disposed.

Referring to FIGS. 8A and 9, each of the main separation structures MS and the auxiliary separation structures SS include a separation pattern 164 disposed on the lower structure 103, and a spacer 162 surrounding a side of the separation pattern 164. In an example, the separation pattern 164 may be a conductive source plug. For example, the separation pattern 164 may be formed of a conductive material including at least one of a doped polysilicon, a metal nitride such as TiN, a metal silicide such as WSi, TiSi, or TaSi, or a metal such as W. The spacer 162 may be formed of an insulating material such as silicon oxide.

Referring to FIGS. 3, 4A, 8A and 8B, vertical structures VS may be disposed to pass through the stacked structures GS located in the memory blocks BLK, in the vertical direction. In an embodiment, the vertical structures VS are disposed on the lower structure 103. In an embodiment, dummy vertical structures VSd are disposed on the lower structure 103. In an embodiment, the dummy vertical structures VSd are formed to have the same structure as that of the vertical structures VS, while passing through the stacked structures GS.

In an embodiment, each of the vertical structures VS includes a channel semiconductor layer 130 extending in the vertical direction, and a gate dielectric structure 128 disposed between the channel semiconductor layer 130 and the stacked structures GS.

In an embodiment, each of the vertical structures VS further includes a semiconductor pattern 122, a core pattern 132 on the semiconductor pattern 122, and a pad pattern 134 on the core pattern 132.

The channel semiconductor layer 130 may be disposed to surround an external side of the core pattern 132 while being in contact with the semiconductor pattern 122. The gate dielectric structure 128 may be disposed to surround an external side of the channel semiconductor layer 130. The semiconductor pattern 122 may be an epitaxial material layer formed by a selective epitaxial growth (SEG) process. The core pattern 132 may be formed of an insulating material such as silicon oxide. The pad pattern 134 may be formed of polysilicon having an N-type conductivity, or may be a drain region. The pad pattern 134 may be disposed on a level higher than that of the gate structures GS.

In an embodiment, the channel semiconductor layer 130 extends in a direction perpendicular to a surface of the lower structure 103, and penetrates through the intermediate gate electrodes G_M and the upper gate electrode G_U of the stacked structure GS. The channel semiconductor layer 30 may be formed of a polysilicon layer.

In an embodiment, the gate dielectric structure 128 includes a tunnel dielectric 126, a data storage layer 125, and a blocking dielectric 124. The data storage layer 125 may be disposed between the tunnel dielectric layer 126 and the blocking dielectric 124. The blocking dielectric 124 may be disposed between the data storage layer 125 and the stacked structure GS. The tunnel dielectric 126 may be disposed between the data storage layer 125 and the channel semiconductor layer 130. The tunnel dielectric 126 may include silicon oxide and/or impurity-doped silicon oxide. The blocking dielectric 126 may include silicon oxide and/or a high dielectric. The data storage layer 125 may be formed of a material capable of storing information, for example, silicon nitride.

The data storage layer 125 may include data storage regions 125*d* in which information is stored, between the channel semiconductor layer 130 and the intermediate gate electrodes G_M that may be word lines. In this case, for example, electrons injected into the data storage regions 125*d*, from the channel semiconductor layer 130, through the tunnel dielectric 126, may be trapped to be retained, or electrons trapped in the data storage regions 125*d* of the data storage layer 125 may be erased, depending on operating conditions of a nonvolatile memory device such as a flash memory device. Thus, the memory cells (see MCT of FIG. 1B) described above with reference to FIG. 1B may include the data storage regions 125*d*.

In an embodiment, an additional gate dielectric 155 is disposed between the gate electrodes G_L, G_B1, G_M, G_B2 and G_U and the vertical structures VS, to extend onto respective upper and lower surfaces of the gate electrodes G_L, G_B1, G_M, G_B2 and G_U. The additional gate dielectric 155 may be formed of a high dielectric such as aluminum oxide.

In an embodiment, bit line contact plugs 175 are disposed on the pad patterns 134 of the vertical structures VS. Thus, the vertical structures VS may be electrically connected to the bit lines (see BL in FIG. 1A and BL1 and BL2 in FIG. 1B) described above with reference to FIGS. 1A and 1B, through the bit line contact plugs 175.

Referring to FIGS. 5A, 5B, 7A and 7B, in an embodiment, the thickness of each of the pads P of the intermediate gate electrodes G_M in the vertical direction is greater than the thickness of each of the intermediate gate electrodes G_M in the vertical direction. In an embodiment, at least a portion of the pads P of the upper gate electrodes G_U and G_B2 has a thickness greater than the thickness of each of the upper gate electrodes G_U and G_B2. In an embodiment, at least a portion of the pads P of the lower gate electrodes G_L and G_B1 has a thickness greater than the thickness of each of the lower gate electrodes G_L and G_B1. However, exemplary embodiments thereof are not limited thereto.

Figure 10:
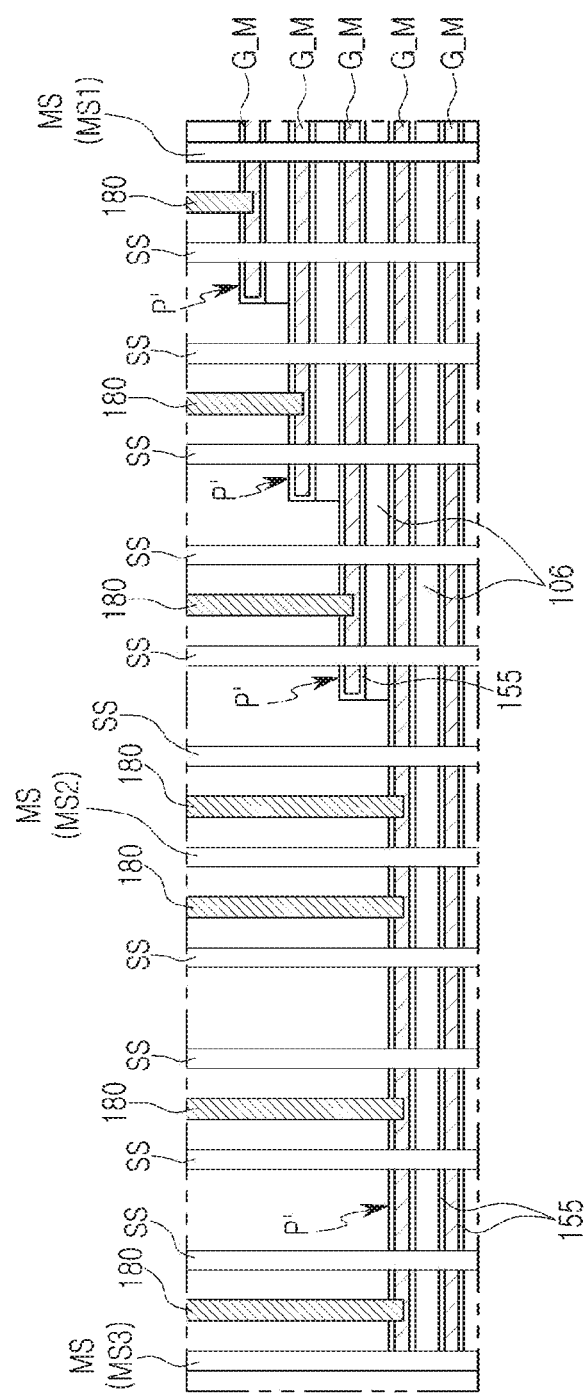
FIG. 10 is a partially enlarged cross-sectional view illustrating a modified example of a three-dimensional semiconductor device according to an exemplary embodiment of the present inventive concept.

In a modified example, referring to FIG. 10, pads P' of the gate electrodes G_L, G_B1, G_M, G_B2 and G_U have the same thickness as that of the gate electrodes G_L, G_B1, G_M, G_B2 and G_U. In this case, FIG. 10 is a partially enlarged view illustrating a portion corresponding to FIG. 5B.

Figure 11:
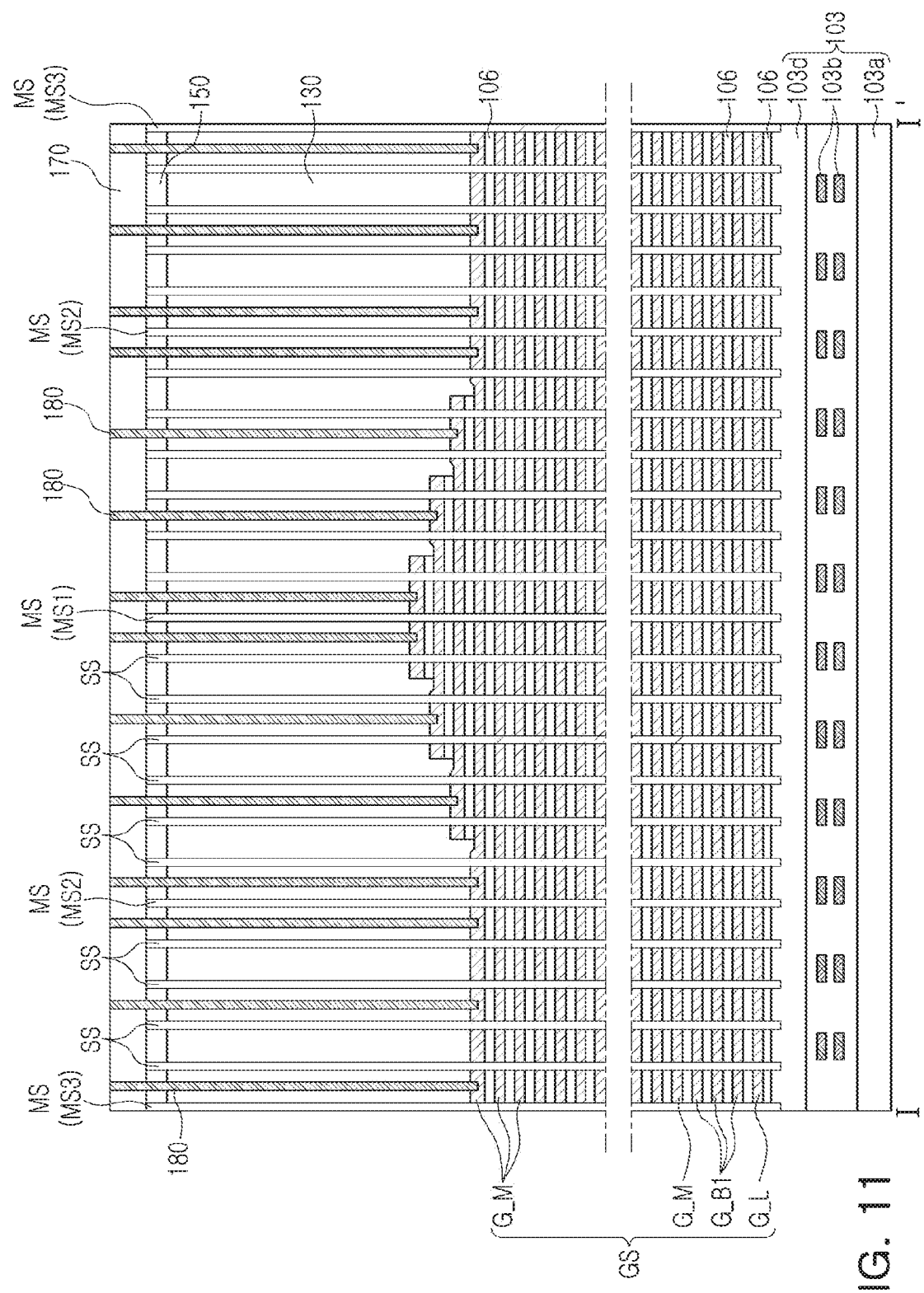
FIG. 11 is a cross-sectional view illustrating a modified example of a three-dimensional semiconductor device according to an exemplary embodiment of the present inventive concept.

In an exemplary embodiment, the lower substructure 103 is a bulk semiconductor substrate, but the inventive concept is not limited thereto. In a modified example, referring to FIG. 11, the lower structure 103 includes a lower substrate 103a, a peripheral circuit structure 103b disposed on the lower substrate 103a, and an upper substrate 103d disposed on the peripheral circuit structure 103b. The lower substrate 103a may be a single crystal silicon substrate, and the upper substrate 103d may be a polysilicon substrate. In this case, FIG. 11 is a cross-sectional view of a region taken along line I-I' of FIG. 4A.

Referring again to FIGS. 3, 4A and 4B, in the extension and reduction regions EA1a, EA1b, EA2a and EA2b, in an embodiment, structures including the main separation structures MS and the auxiliary separation structures SS are arranged to have a constant spacing therebetween in the second direction Y.

Figure 12A:
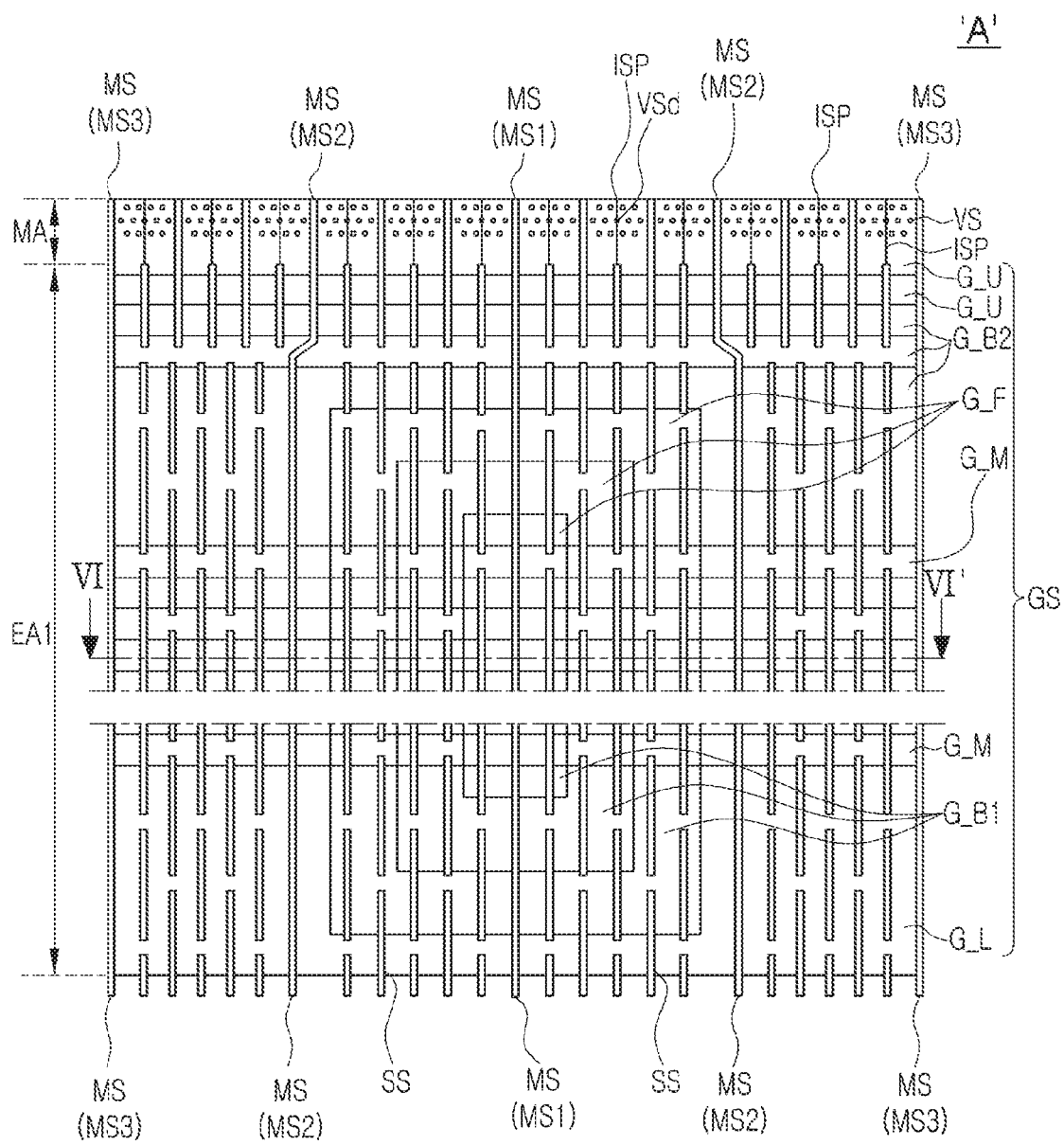
FIGS. 12A to 13B are views illustrating a modified example of a three-dimensional semiconductor device according to an exemplary embodiment of the present inventive concept.
Figure 12B:
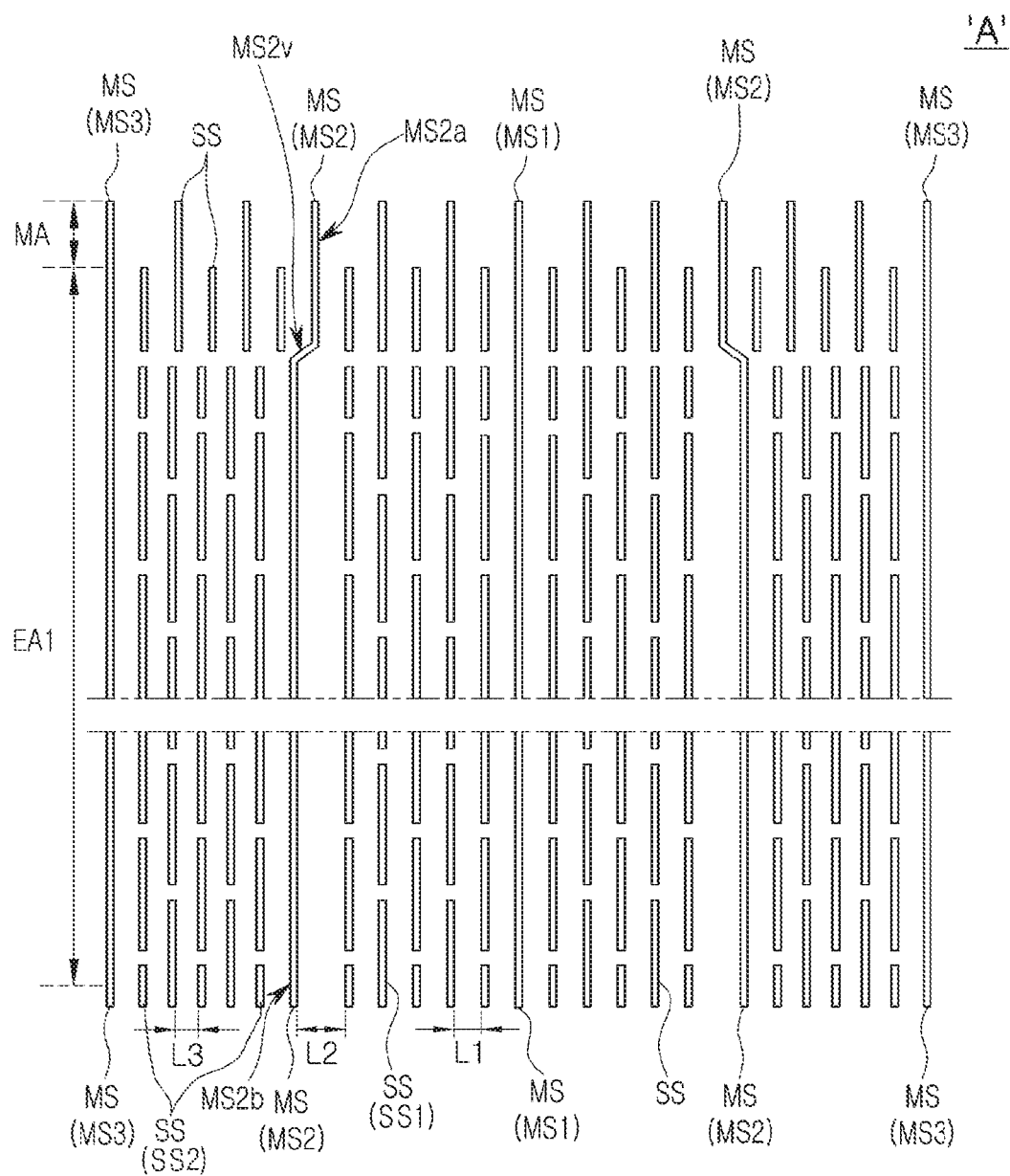
Figure 13A:
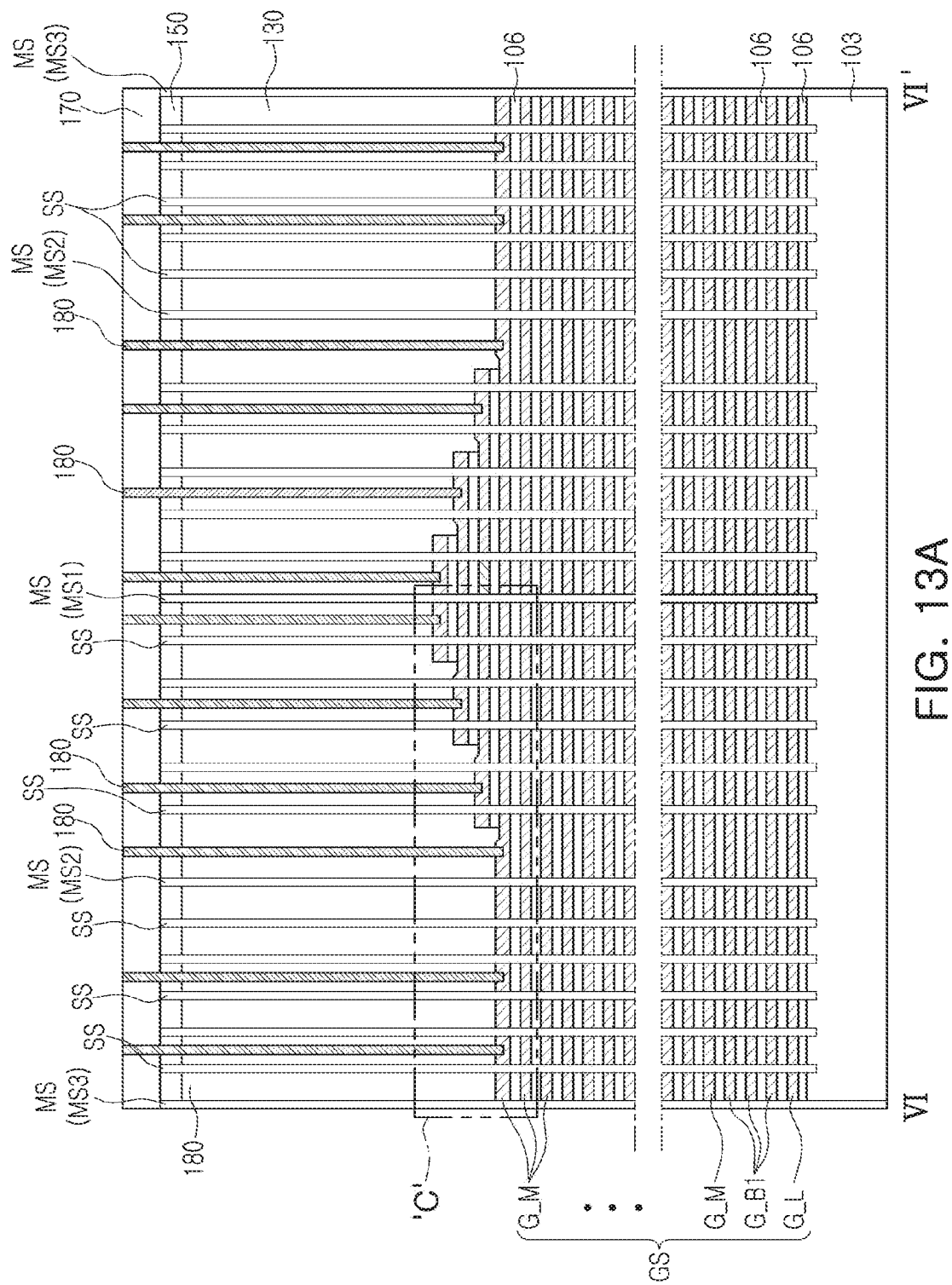
Figure 13B:
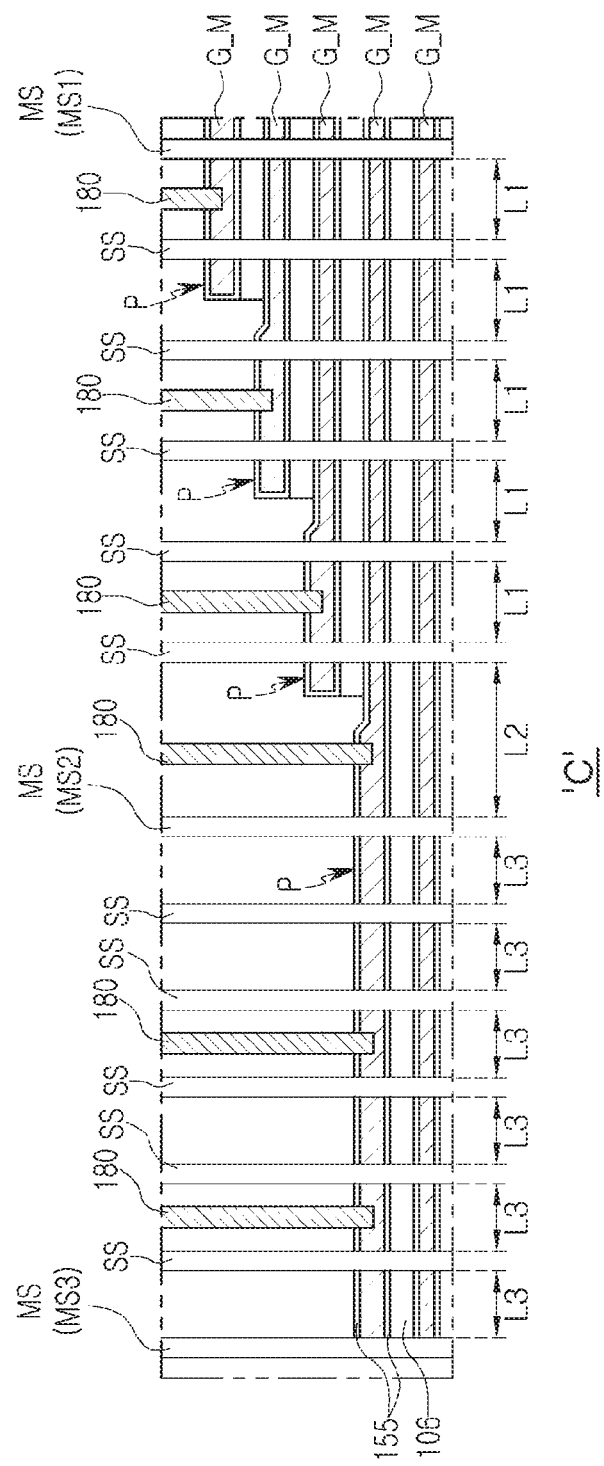

In the extension and reduction regions EA1a, EA1b, EA2a and EA2b, in an embodiment, the number of first auxiliary separation structures SS1 arranged in the second direction Y, between the second portion MS2b of the second main separation structure MS2 and the first main separation structure MS1, is greater than the number of second auxiliary separation structures SS2 arranged in the second direction Y, between the second portion MS2b of the second main separation structure MS2 and the third main separation structure MS3. However, the inventive concept is not limited thereto, and may be modified as illustrated in FIGS. 12A, 12B, 13A and 13B. FIG. 12A is a partially enlarged plan view illustrating portion A of FIG. 3. FIG. 12B is a plan view illustrating portions of components in FIG. 12A. FIG. 13A is a cross-sectional view of a region taken along line VI-VI' of FIG. 12A. FIG. 13B is a partially enlarged view illustrating portion C of FIG. 13A.

Referring to FIG. 3 and FIGS. 12A to 13B, in the extension and reduction regions EA1a, EA1b, EA2a and EA2b, in an embodiment, the number of the first auxiliary separation structures SS1 arranged in the second direction Y, between the second portion MS2b of the second main separation structure MS2 and the first main separation structure MS1, is identical to the number of the second auxiliary separation structures SS2 arranged in the second direction Y, between the second portion MS2b of the second main separation structure MS2 and the third main separation structure MS3.

In an embodiment, an interval L1 (e.g., space or pitch) between the first auxiliary separation structures SS1 arranged in the second direction Y, between the second portion MS2b of the second main separation structure MS2 and the first main separation structure MS1, is greater than a third interval L3 between the second auxiliary separation structures SS2 arranged in the second direction Y, between the second portion MS2b of the second main separation structure MS2 and the third main separation structure MS3.

In an embodiment, among the first auxiliary separation structures SS1 arranged in the second direction Y between the second portion MS2b of the second main separation structure MS2 and the first main separation structure MS1, a second interval L2 between the first auxiliary separation structure SS1, adjacent to the second portion MS2b of the second main separation structure MS2, and the second portion MS2b of the second main separation structure MS2, is greater than the first interval L1 and the third interval L3.

Figure 14:
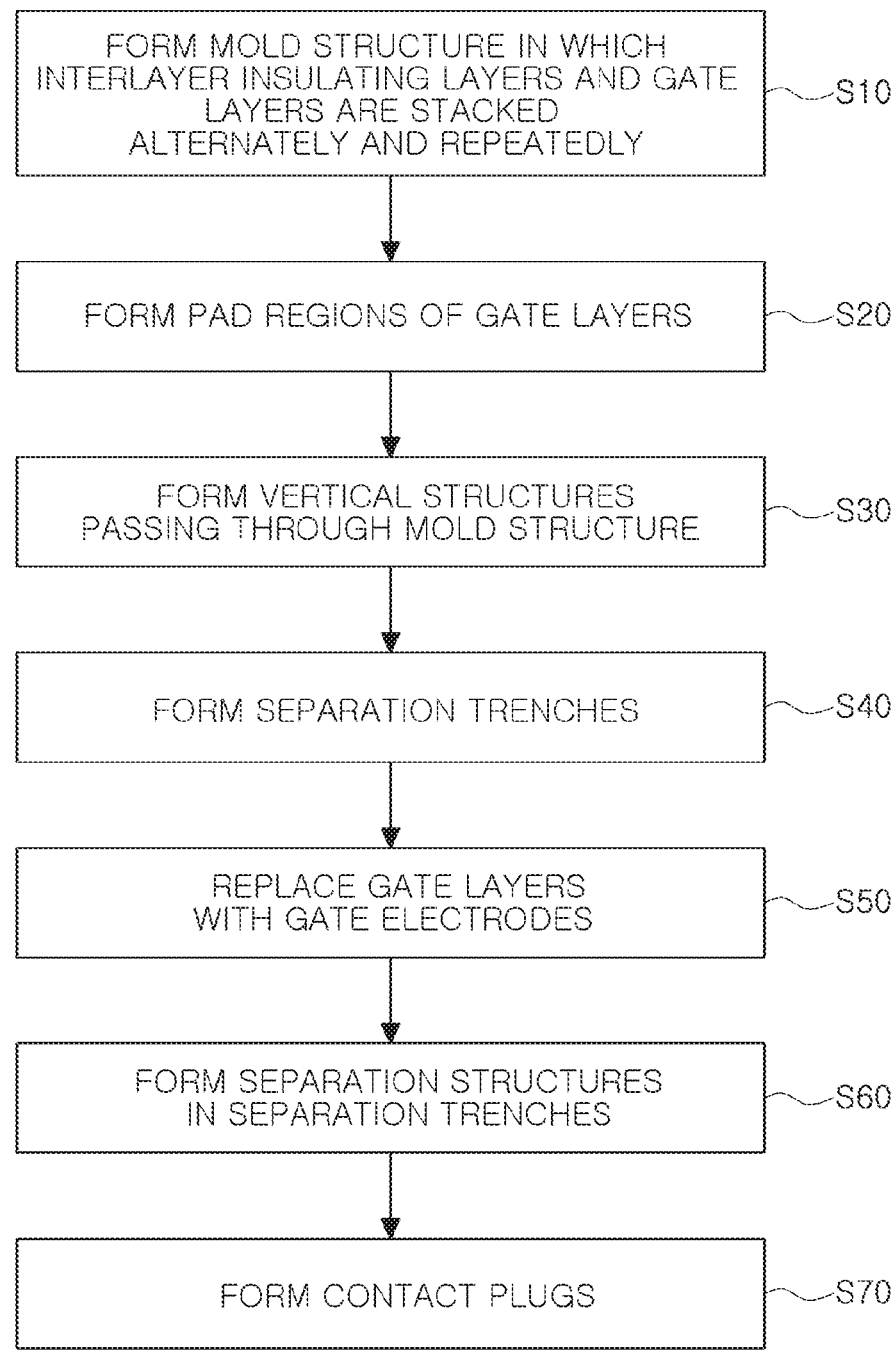
FIG. 14 is a process flow chart illustrating a method of forming a three-dimensional semiconductor device according to an exemplary embodiment of the present inventive concept.
Figure 15A:
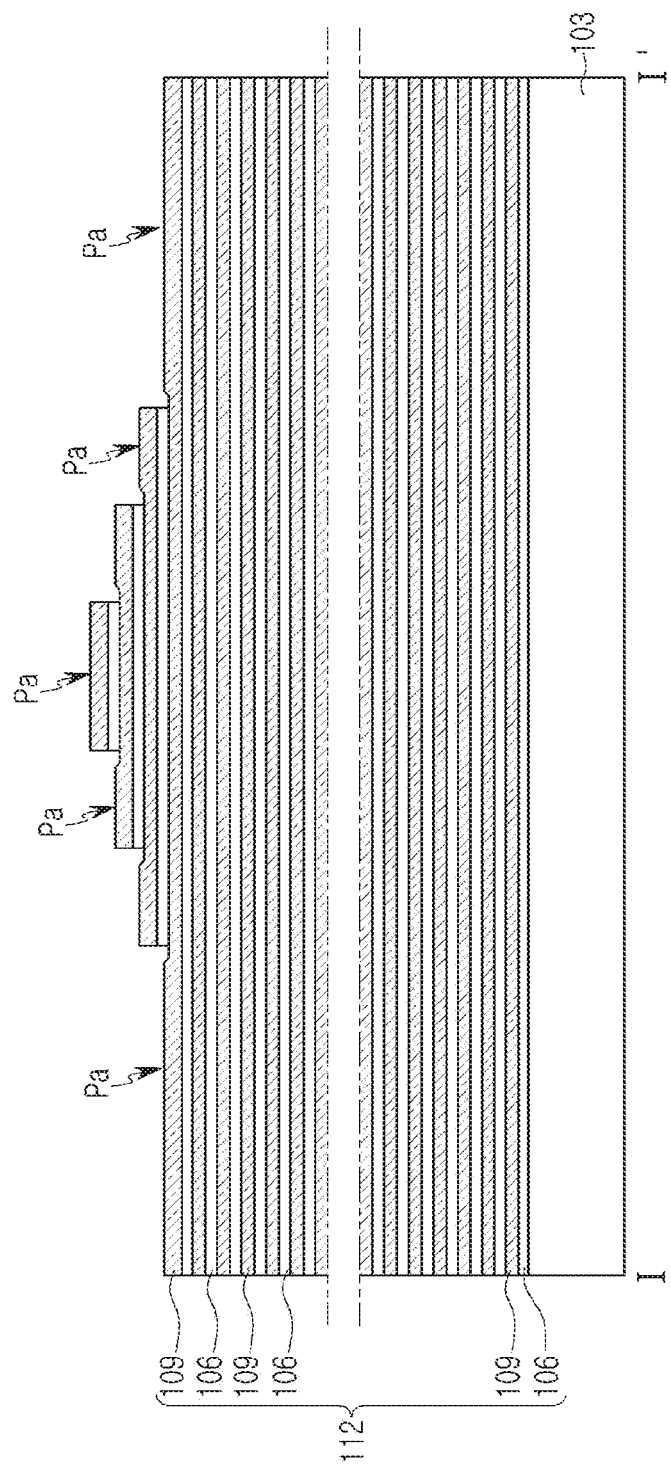
FIGS. 15A to 17B are cross-sectional views illustrating a method of forming a three-dimensional semiconductor device according to an exemplary embodiment of the present inventive concept.

Next, referring to FIGS. 14 to 17b, an example of a method of forming a three-dimensional semiconductor device according to an exemplary embodiment of the inventive concept will be described below. FIG. 14 is a process flow chart illustrating a method of forming a three-dimensional semiconductor device according to an exemplary embodiment of the inventive concept. FIGS. 15A, 16A and 17A are cross-sectional views of regions taken along line I-I' of FIG. 4A, and FIGS. 15B, 16B and 17B are cross-sectional views illustrating regions taken along line II-II' of FIG. 4A.

Figure 15B:
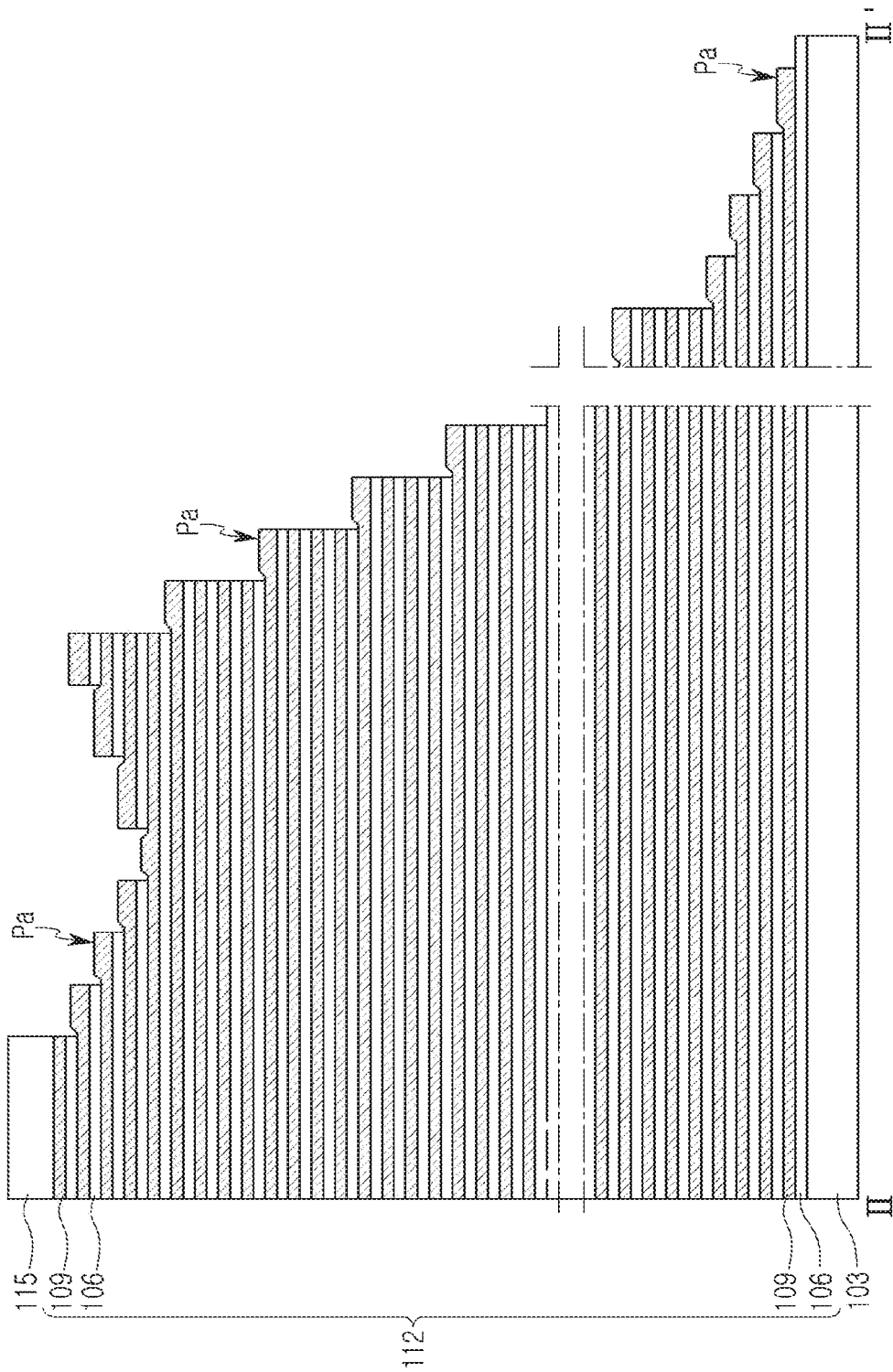
Figure 16A:
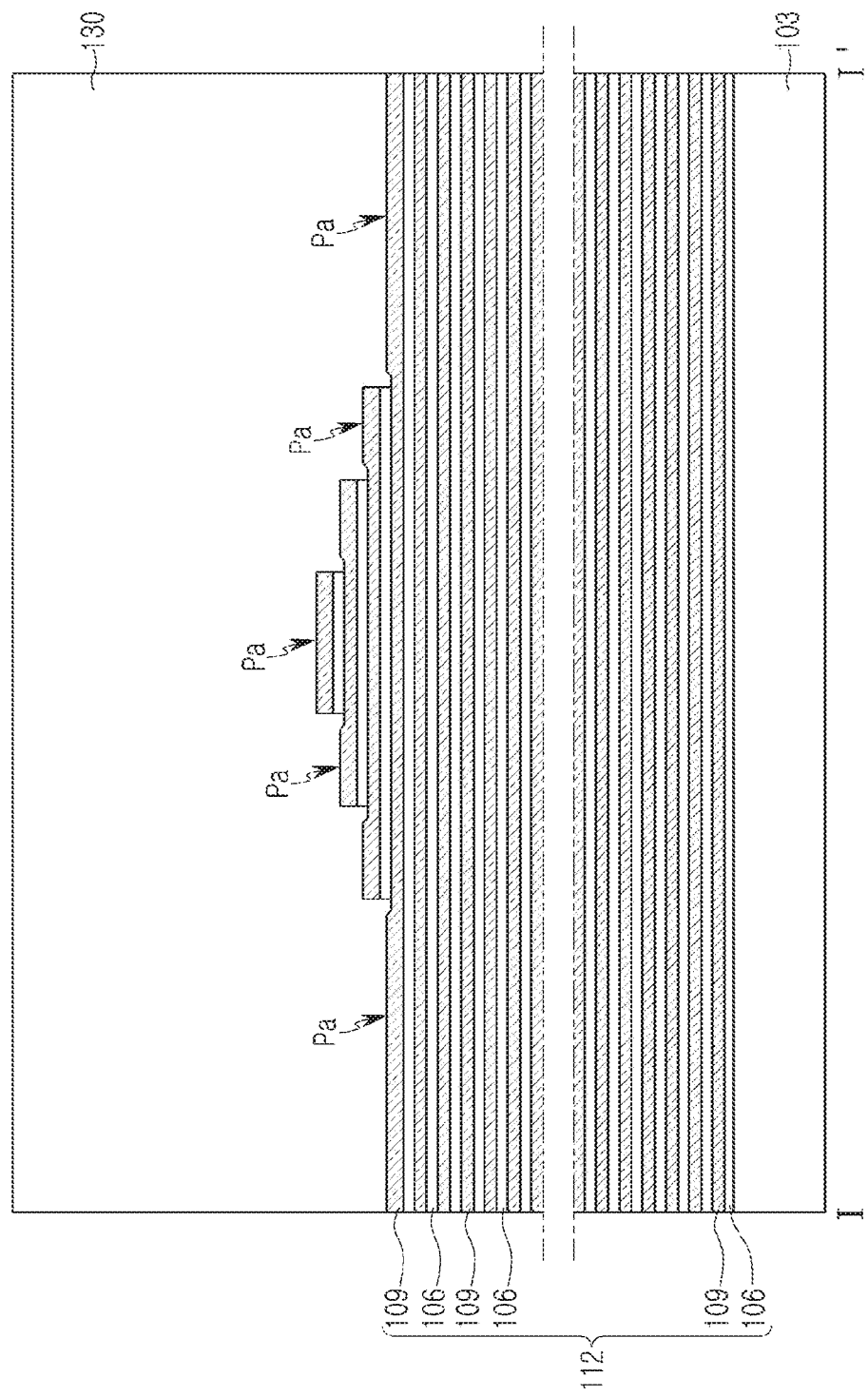

Referring to FIGS. 14, 15A and 15B, a mold structure 112 is formed to include interlayer insulating layers 106 and gate layers 109 stacked alternately and repeatedly, in S10. The mold structure 112 may be formed on a lower structure 103. The interlayer insulating layers 106 may be formed of silicon oxide, and the gate layers 109 may be formed of silicon nitride.

Pad regions Pa of the gate layers 109 are formed in S20. The formation of the pad regions Pa may include forming a capping insulating layer 115 on the mold structure 112, to protect a region in which memory blocks are to be formed, forming pad regions in a stepped shape by patterning the gate layers 109 using photolithography and etch processes, and performing a process of increasing a thickness of the pad regions formed in the stepped shape. In this case, the process of increasing the thickness of the pad regions may include forming a pad layer having a relatively thick thickness on a plane and a relatively thin thickness on a side, and forming a pad layer remaining on a plane by isotropically etching the pad layer. In this case, the remaining pad layer may be formed of the same material as that of the gate layers 109.

Figure 16B:
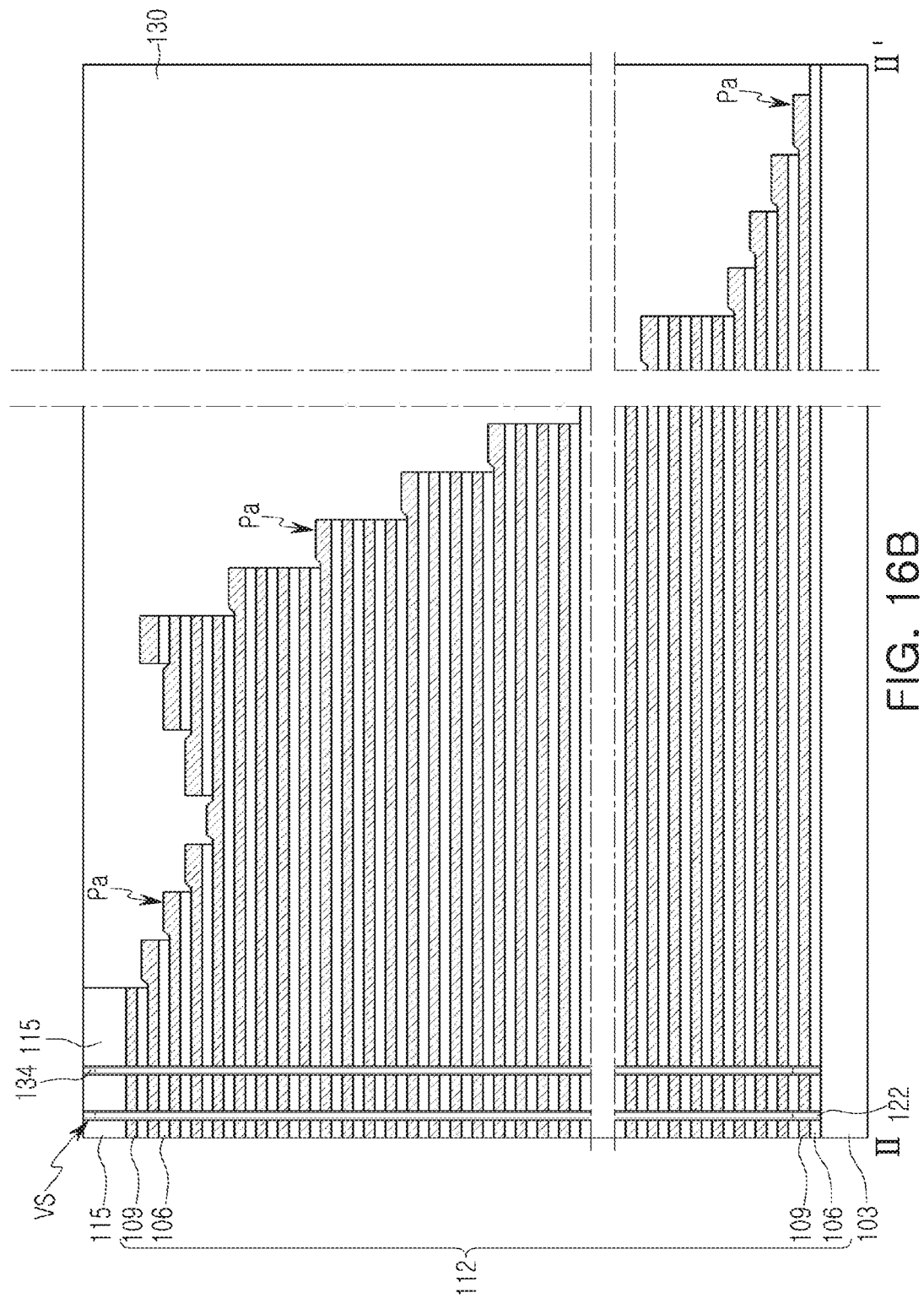
Figure 17A:
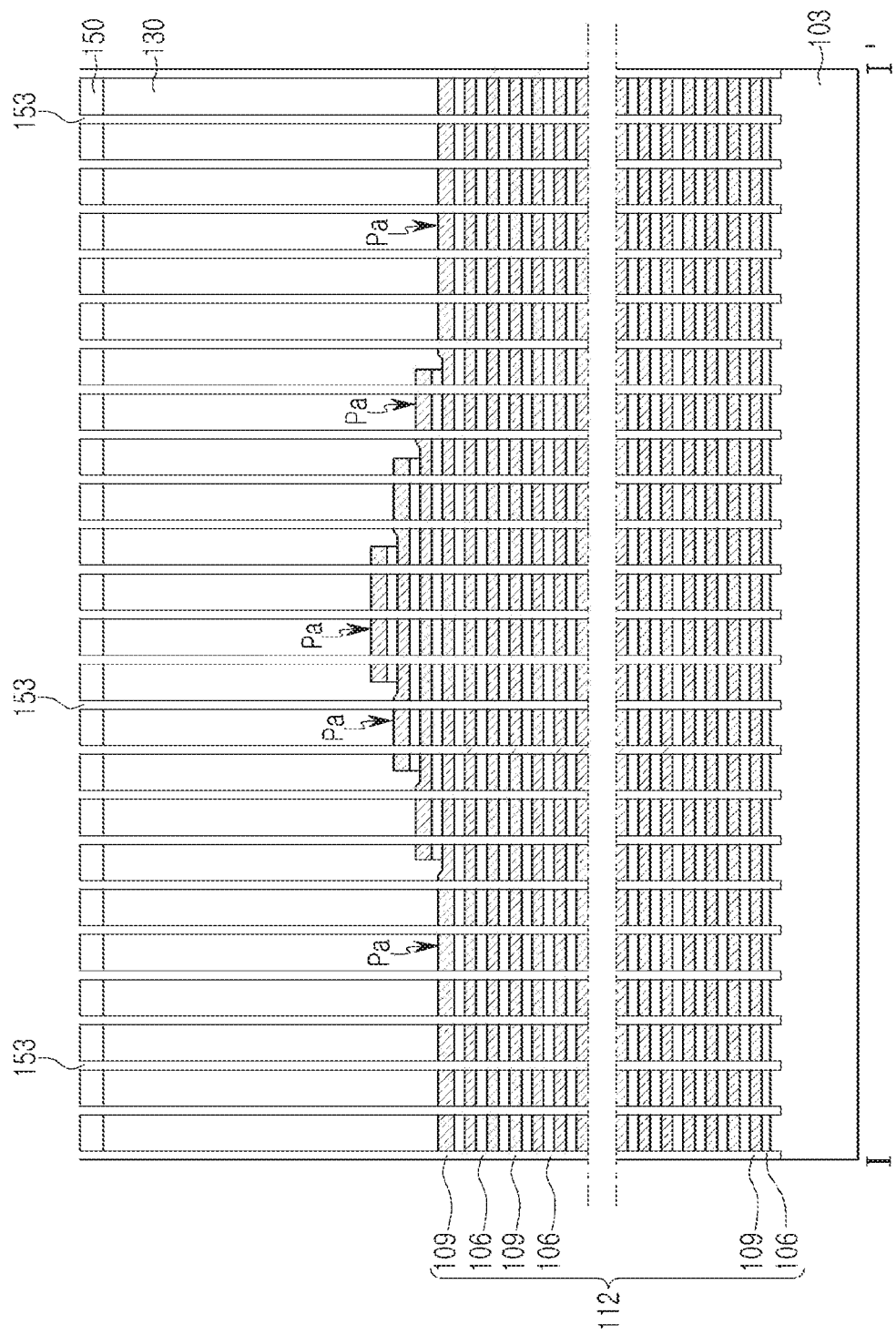

Referring to FIGS. 14, 16A and 16B, a first insulating layer is deposited on the mold structure 112 in which the pad regions Pa are formed. The first insulating layer may be planarized until an upper surface of the first capping insulating layer 115 is exposed, thereby forming the planarized first insulating layer 130. Vertical structures VS are formed to pass through the mold structure 112 in S30. The vertical structures VS may be the vertical structures VS described above with reference to FIG. 8B. For example, forming the vertical structures VS may include forming channel holes penetrating through the first capping insulating layer 115 and the mold structure 112 and filling the vertical structures VS.

Figure 17B:
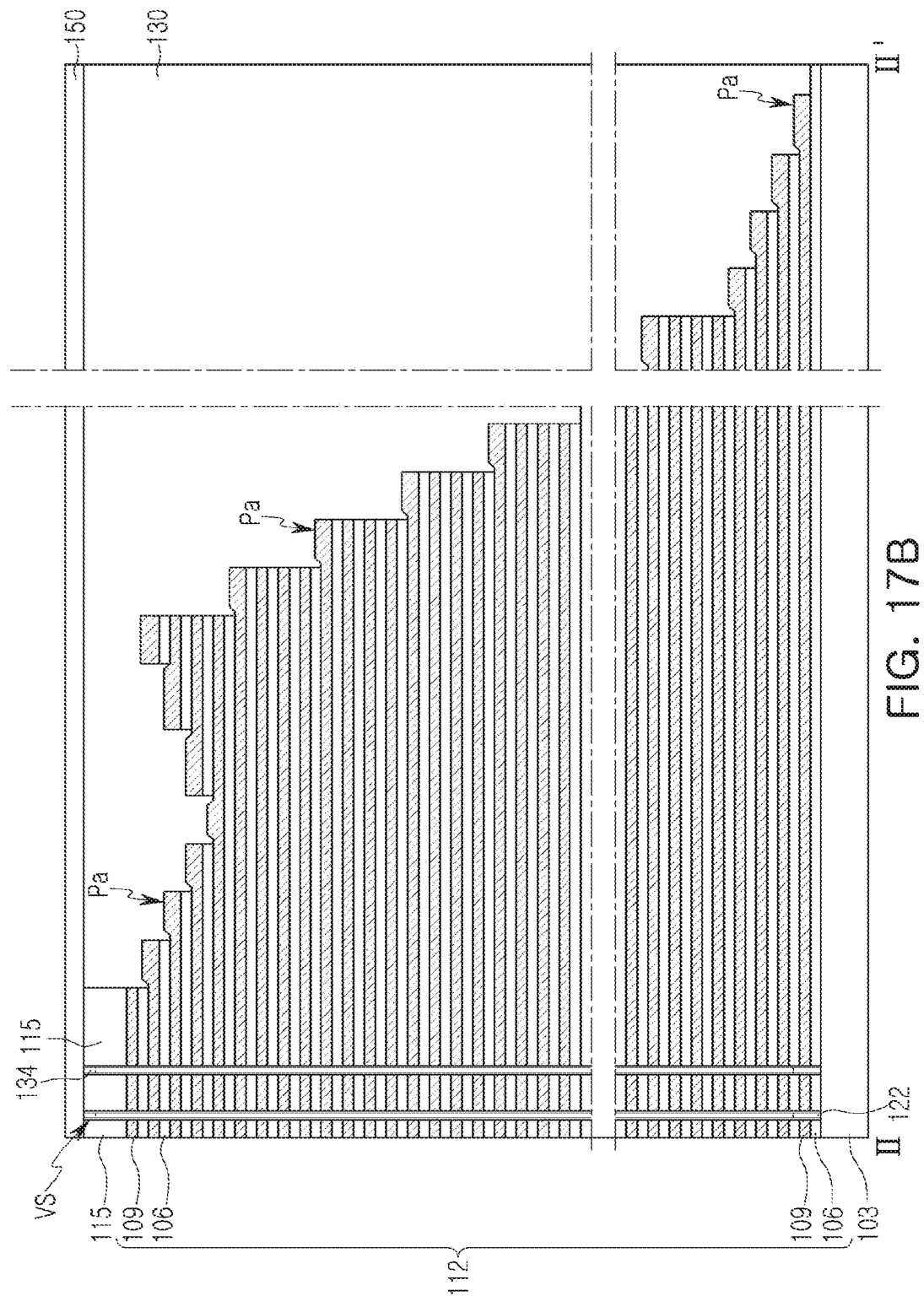

Referring to FIGS. 14, 17A and 17B, a second insulating layer 150 may be formed on the first capping insulating layer 115 and the first insulating layer 130. Isolation trenches 153 are formed in S40. The formation of the isolation trenches 153 may include patterning the first capping insulating layer 115, the first insulating layer 130, the second insulating layer 150 and the mold structure 112 to expose the lower substructure 103. The isolation trenches 153 may be formed in a planar shape similarly to the planar shape of the main separation structures MS and the auxiliary separation structures SS described above with reference to FIGS. 3, 4B and 12B.

Referring again to FIGS. 2 to 9, together with FIG. 14, the gate layers 109 are replaced with gate electrodes G_L, G_B1, G_M, G_B2 and G_U in S50. Replacing the gate layers 109 with the gate electrodes G_L, G_B1, G_M, G_B2 and G_U may include removing the gate layers 109 exposed by the isolation trenches 153 to form voids, and forming the gate electrodes G_L, G_B1, G_M, G_B2 and G_U in the voids. Subsequently, the main separation structures MS and the auxiliary separation structures SS are formed to fill the isolation trenches 153 in S60. A third insulating layer 170 may be formed on the second insulating layer 150. Bit line plugs 175 may be formed to penetrate through the second and third insulating layers 150 and 170 and electrically connected to the vertical structures VS. Then, contact plugs 180 are formed in S70. The contact plugs 180 may be electrically connected to pads of the gate electrodes G_L, G_B1, G_M, G_B2 and G_U.

According to an exemplary embodiment of the inventive concept, a three-dimensional semiconductor device 1 is provided that includes gate electrodes G_L, G_B1, G_M, G_B2 and G_U divided in a horizontal direction (e.g., in the second direction Y) by separation structures MS. According to an exemplary embodiment, a three-dimensional semiconductor device is provided to have a structure, in which a distance between the separation structures MS in respective memory blocks BLK, and a distance between separation structures MS in extended regions EA1 and EA2 in which pads P of the gate electrodes G_L, G_B1, G_M, G_B2 and G_U are formed, are different from each other. By providing the separation structures MS, the number of stacks of the gate electrodes G_L, G_B1, G_M, G_B2 and G_U may further be increased, and the pads P of the gate electrodes G_L, G_B1, G_M, G_B2 and G_U may be more efficiently arranged and formed. Thus, the degree of integration of the semiconductor device may be improved.

As set forth above, according to exemplary embodiments, a three-dimensional semiconductor device is provided including separation structures by which gate electrodes are divided in a horizontal direction. According to the exemplary embodiments, a structure is provided, in which a separation distance between separation structures in a memory block, and a separation distance between separation structures in extended regions in which gate pads are formed, are different from each other. By providing such separation structures, the number of stacked gate electrodes may further be increased, and gate pads may be more efficiently disposed and formed. Thus, the degree of integration of the semiconductor device may be improved.

While exemplary embodiments of the inventive concept have been shown and described above, it will be apparent to those skilled in the art that modifications and variations can be made without departing from the scope of the present inventive concept.

What is claimed is:

1. A three-dimensional semiconductor device comprising:
a first extended region and a second extended region, disposed on a substrate, spaced apart from each other;
a memory block disposed on the substrate between the first extended region and the second extended region; and
a first main separation structure and a second main separation structure disposed on the substrate spaced apart from each other,
wherein the first extended region, the memory block and the second extended region are disposed between the first and the second main separation structures, the memory block includes data storage regions and word lines, the word lines extend from the memory block and pass through the first extended region and the second extended region, and a distance between the first and second main separation structures located on both sides of the first extended region is greater than a distance between the first and second main separation structures located on both sides of the memory block.

2. The three-dimensional semiconductor device of claim 1, wherein a distance between the first and the second main separation structures located on both sides of the second extended region is less than a distance between the first and second main separation structures located on both sides of the memory block.

3. The three-dimensional semiconductor device of claim 1, wherein the memory block further comprises a channel semiconductor layer, the word lines are stacked on top of one another and spaced apart from each other, in a direction perpendicular to an upper surface of the substrate, the channel semiconductor layer is spaced apart from the word lines, and passes through the word lines, and the data storage regions are disposed between the channel semiconductor layer and the word lines.

4. The three-dimensional semiconductor device of claim 1, wherein the word lines comprise first word line pads arranged in a first stepped shape in the first extended region, and second word line pads arranged in a second stepped shape in the second extended region, the first and the second stepped shapes comprise a step lowered by a first step height in a first direction, the first stepped shape further comprises a step lowered by a second step height in a second direction, and the second direction is a direction perpendicular to the first direction.

5. The three-dimensional semiconductor device of claim 4, wherein the first step height is greater than the second step height.

6. The three-dimensional semiconductor device of claim 1, further comprising auxiliary separation structures having a linear shape and extending in a first direction, the auxiliary separation structures passing through the word lines in a vertical direction, between the first and the second main separation structures, wherein the vertical direction is a direction perpendicular to an upper surface of the substrate, and the first direction is a direction parallel to the upper surface of the substrate.

7. The three-dimensional semiconductor device of claim 6, wherein a length of each of the first and second main separation structures in the first direction is greater than a length of each of the auxiliary separation structures in the first direction.

8. A three-dimensional semiconductor device comprising:
a first main separation structure, a second main separation structure and a third main separation structure, disposed on a substrate, spaced apart from each other;
a first stacked structure disposed on the substrate between the first main separation structure and the second main separation structure; and
a second stacked structure disposed on the substrate between the second main separation structure and the third main separation structure, wherein the first and the third main separation structures have linear shapes, parallel to each other, the second main separation structure is disposed between the first and third main separation structures, the second main separation structure includes a first portion and a second portion parallel to the first main separation structure and the third main separation structure, and a distance between the second portion of the second main separation structure and the first main separation structure is greater than a distance between the first portion of the second main separation structure and the first main separation structure.

9. The three-dimensional semiconductor device of claim 8, wherein the first portion of the second main separation structure is centrally located between the first and the third main separation structures, and the second portion of the second main separation structure is closer to the third main separation structure than the first main separation structure.

10. The three-dimensional semiconductor device of claim 9, wherein the second main separation structure further comprises a third portion parallel to the first and the third main separation structures, and the third portion of the second main separation structure is closer to the first main separation structure than the third main separation structure.

11. The three-dimensional semiconductor device of claim 8, wherein the second main separation structure further comprises a bent portion connecting the first and the second portions to each other.

12. The three-dimensional semiconductor device of claim 8, wherein each of the first and the second stacked structures comprises gate electrodes disposed on the substrate, stacked on one another, and spaced apart from each other in a direction perpendicular to an upper surface of the substrate.

13. The three-dimensional semiconductor device of claim 8, wherein gate electrodes of the first stacked structure comprise pads arranged in a first stepped shape, between the first main separation structure and the second portion of the second main separation structure, and gate electrodes of the second stacked structure comprise pads arranged in a second stepped shape different from the first stepped shape, between the third main separation structure and the second portion of the second main separation structure.

14. The three-dimensional semiconductor device of claim 8, further comprising: first auxiliary separation structures disposed between the second portion of the second main separation structure and the first main separation structure; and second auxiliary separation structures disposed between the second portion of the second main separation structure and the third main separation structure.

15. The three-dimensional semiconductor device of claim 14, wherein the number of the first auxiliary separation structures arranged in a direction from the second portion of the second main separation structure to the first main separation structure is greater than the number of the second auxiliary separation structures arranged in a direction from the second portion of the second main separation structure to the third main separation structure.

16. The three-dimensional semiconductor device of claim 14, wherein the number of the first auxiliary separation structures arranged in a direction from the second portion of the second main separation structure to the first main separation structure is equal to the number of the second auxiliary separation structures arranged in a direction from the second portion of the second main separation structure to the third main separation structure.

17. The three-dimensional semiconductor device of claim 16, wherein an interval between the first auxiliary separation structures is greater than an interval between the second auxiliary separation structures.

18. A three-dimensional semiconductor device comprising:
a substrate;
first, second, and third separation structures disposed spaced apart from one another on the substrate, the second separation structure disposed between the first and third separation structures, the first and third separation structures having linear shapes, and the second separation structure including first and second bent portions and a first linear portion between the first and the second bent portions;
first and second extended regions disposed on the substrate between the first separation structure and the second separation structure;
third and fourth extended regions disposed on the substrate between the second separation structure and the third separation structure;
a first memory block disposed on the substrate between the first separation structure and the second separation structure and between the first and the second extended regions; and
a second memory block disposed on the substrate between the second separation structure and the third separation structure and between the third and the fourth extended regions,
wherein the first memory block includes word lines that extend into the first and second extended regions, and wherein the second memory block includes word lines that extend into the third and fourth extended regions.

19. The three-dimensional semiconductor device of claim 18, wherein the first bent portion contacts the first and the third extended regions and the second bent portion contacts the second and the fourth extended regions.

20. The three-dimensional semiconductor device of claim 19, the second separation structure includes second and third linear portions, the second linear portion contacting the first and the third extended regions, and the third linear portion contacting the second and the fourth extended regions.

* * * * *